United States Patent
Watanabe

(10) Patent No.: US 11,271,548 B2
(45) Date of Patent: Mar. 8, 2022

(54) STARTING CIRCUIT

(71) Applicant: SONY SEMICONDUCTOR SOLUTIONS CORPORATION, Kanagawa (JP)

(72) Inventor: Hiroyuki Watanabe, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/056,362

(22) PCT Filed: Feb. 22, 2019

(86) PCT No.: PCT/JP2019/006918
§ 371 (c)(1),
(2) Date: Nov. 17, 2020

(87) PCT Pub. No.: WO2019/225094
PCT Pub. Date: Nov. 28, 2019

(65) Prior Publication Data
US 2021/0211119 A1    Jul. 8, 2021

(30) Foreign Application Priority Data

May 23, 2018 (JP) .............................. JP2018-098489

(51) Int. Cl.
*H03K 3/012* (2006.01)
*H03K 17/687* (2006.01)
(Continued)

(52) U.S. Cl.
CPC ............... *H03K 3/012* (2013.01); *G05F 3/26* (2013.01); *H03K 17/22* (2013.01);
(Continued)

(58) Field of Classification Search
CPC .. H03K 3/012; H03K 17/6872; H03K 17/223; H03K 17/22; H03K 3/02335;
(Continued)

(56) References Cited

U.S. PATENT DOCUMENTS 5,955,874 A    9/1999 Zhou et al.
8,188,785 B2 *  5/2012 Iacob ..................... G05F 1/10
                                                327/543
(Continued)

FOREIGN PATENT DOCUMENTS

CN    102915070 A    2/2013
JP    2002-108468 A   4/2002
(Continued)

OTHER PUBLICATIONS

Vadim Ivanov, "Analog Techniques for Nano-power Circuits", ISSCC 2015 Tutorial, Feb. 22, 2015, 63 pages.
(Continued)

*Primary Examiner* — Jung Kim
(74) *Attorney, Agent, or Firm* — Chip Law Group

(57) ABSTRACT

A starting circuit capable of further reducing an influence of a variation in the threshold voltage of a transistor is proposed. The starting circuit includes an N-type first MOS transistor whose threshold voltage is near 0 V, a resistor interposed between a source terminal of the first MOS transistor and a ground, and a control circuit controlling a gate voltage of the first MOS transistor. An amount of first current transmitted to a device to be driven and starting the device is controlled according to the control of the gate voltage.

10 Claims, 9 Drawing Sheets

(51) Int. Cl.
*H03K 17/22* (2006.01)
*G05F 3/26* (2006.01)

(52) U.S. Cl.
CPC . *H03K 17/6872* (2013.01); *H03B 2200/0038* (2013.01); *H03D 2200/0033* (2013.01)

(58) Field of Classification Search
CPC ............. H03K 3/0375; H03K 17/6871; H03K 17/6874; H03K 2017/6875; G05F 3/26; H03B 2200/0038; H03F 2203/45054; H03D 2200/0033
See application file for complete search history.

(56) References Cited

U.S. PATENT DOCUMENTS

| | | |
|---|---|---|
| 2002/0042176 A1 | 4/2002 | Ikehashi |
| 2007/0164722 A1 | 7/2007 | Rao et al. |
| 2013/0033251 A1 | 2/2013 | Naktomo |

FOREIGN PATENT DOCUMENTS

| | | |
|---|---|---|
| JP | 2008-154020 A | 7/2008 |
| JP | 2010-198092 A | 9/2010 |
| JP | 2013-037435 A | 2/2013 |
| KR | 10-2002-0025690 A | 4/2002 |

OTHER PUBLICATIONS

International Search Report and Written Opinion of PCT Application No. PCT/JP2019/006918, dated Mar. 19, 2019, 09 pages of ISRWO.

\* cited by examiner

STARTING CIRCUIT

CROSS REFERENCE TO RELATED APPLICATIONS

This application is a U.S. National Phase of International Patent Application No. PCT/JP2019/006918 filed on Feb. 22, 2019, which claims priority benefit of Japanese Patent Application No. JP 2018-098489 filed in the Japan Patent Office on May 23, 2018. Each of the above-referenced applications is hereby incorporated herein by reference in its entirety.

FIELD

The present disclosure relates to a starting circuit.

BACKGROUND

So-called electronic apparatuses driven by the supply of power have been diversified in recent years. For example, electronic apparatuses driven by a coin battery for a long time or electronic apparatuses with low power consumption in which power is supplied by so-called energy harvesting have also been proposed. Among element circuits configuring the electronic apparatuses with the low power consumption, there are also element circuits with nW power consumption.

Further, a starting circuit is exemplified as one of the element circuits configuring the various electronic apparatuses. As the starting circuit, there are various types of starting circuits according to the required specifications. In recent years, particularly, a starting circuit of a type using an N-type MOS transistor whose threshold voltage is adjusted to be near 0 V, which is called a Native-NMOS, has also been proposed. The starting circuit of the type using Native-NMOS has attracted attention because it can achieve both area saving and low current consumption as compared with other types of starting circuits. For example, Non Patent Literature 1 discloses an example of the starting circuit of the type using the Native-NMOS.

CITATION LIST

Non Patent Literature

Non Patent Literature 1: Vadim Ivanov, "Analog Techniques for Nano-power Circuits," ISSCC 2015 Tutorial, Feb. 22, 2015.

SUMMARY

Technical Problem

On the other hand, in the starting circuit of the type using the N-type MOS transistor whose threshold voltage is adjusted to be near 0 V as described above, a drain current may change according to a variation or a change in the threshold voltage of the MOS transistor. In the starting circuit described above, the change in the drain current may be manifested as a change of a starting current transmitted to a device to be driven by the starting circuit, and may affect, for example, a starting time of the device. Further, when there is a constraint on the starting time of the device to be driven, for example, the starting circuit is designed in consideration of an influence on the starting time due to the change in the drain current described above. As a result, the current consumption may increase.

Accordingly, the present disclosure proposes a starting circuit capable of further reducing an influence of a variation in the threshold voltage of a transistor.

Solution to Problem

According to the present disclosure, a starting circuit is provided that includes: an N-type first MOS transistor whose threshold voltage is near 0 V; a resistor interposed between a source terminal of the first MOS transistor and a ground; and a control circuit controlling a gate voltage of the first MOS transistor, wherein an amount of first current transmitted to a device to be driven and starting the device is controlled according to the control of the gate voltage.

Advantageous Effects of Invention

As described above, according to the present disclosure, a starting circuit capable of further reducing an influence of a variation in the threshold voltage of a transistor is provided.

Note that the above effects are not necessarily limited, and in addition to the above effects or in place of the above effects, any effects described in the present specification or other effects grasped from the present specification may be achieved.

DESCRIPTION OF EMBODIMENTS

Figure 1:
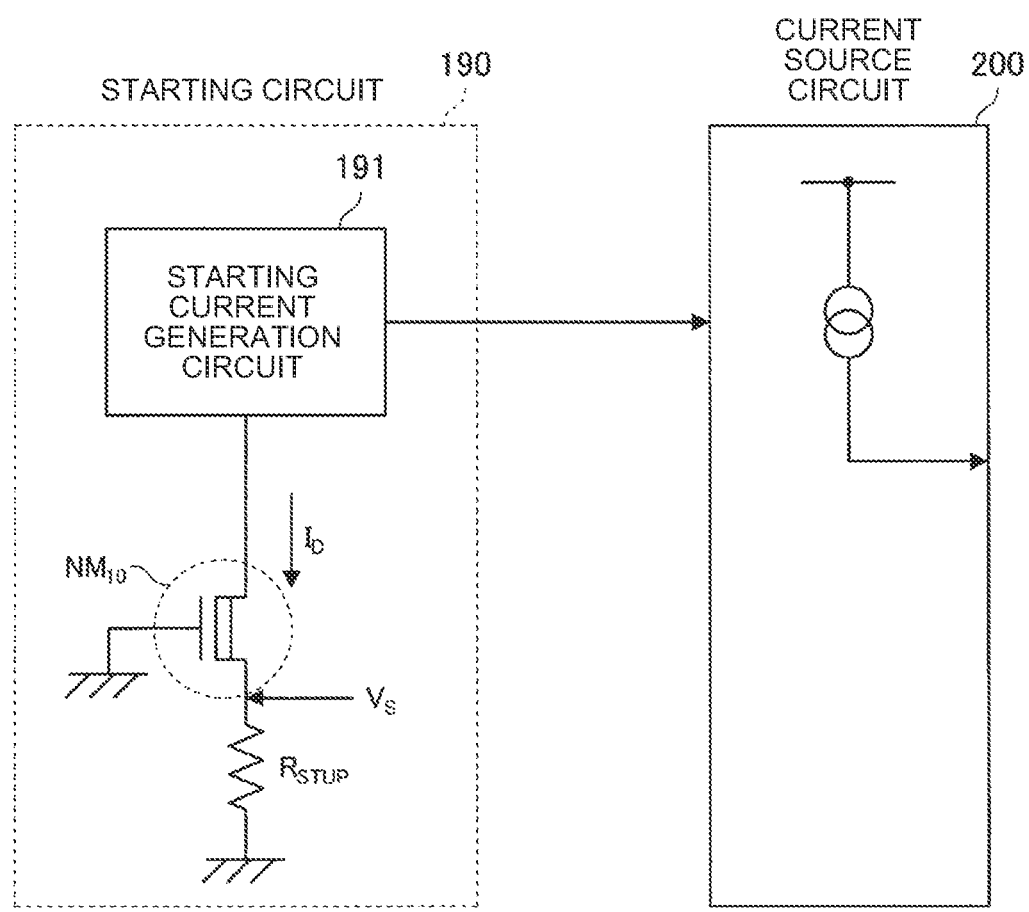
FIG. 1 is an explanatory diagram for explaining an example of a schematic configuration of a starting circuit according to a comparative example.

Hereinafter, preferred embodiments of the present disclosure will be described in detail with reference to the accompanying drawings. Note that same reference numerals are given to components having substantially a same functional configuration, and redundant description will be omitted in the present specification and the drawings.

Note that the description will be given in the following order.
1. Outline of starting circuit
2. Technical problems
3. Technical Features
3.1. Operation principle
3.2. First configuration example
3.3. Second configuration example
3.4. Third configuration example
3.5. Supplement
4. Conclusion

1. Outline of Starting Circuit

First, an outline of a starting circuit will be described with an example. As described above, in recent years, with the diversification of electronic apparatuses, electronic apparatuses with low power consumption have also been proposed. Among element circuits configuring the electronic apparatuses with the low power consumption, there are also element circuits with nW power consumption. A starting circuit is exemplified as one of the element circuits. As the starting circuit, there are various types of starting circuits according to the required specifications. In recent years, particularly, a starting circuit of a type using an N-type MOS transistor whose threshold voltage is adjusted to be near 0 V, which is called a Native-NMOS, has also been proposed.

As described above, since the threshold voltage is near 0 V, the Native-NMOS has a characteristic that a channel leak current flows to some extent even in a state in which a gate terminal is connected to a ground (GND). In other words, the Native-NMOS has a characteristic that a source and a drain are held in a conductive state with a voltage not applied to the gate terminal. The starting circuit of the type using the Native-NMOS has attracted attention because it can achieve both area saving and low current consumption as compared with other types of starting circuits, by using the characteristics of the Native-NMOS as described above.

Here, as a comparative example, an example of the starting circuit of the type using the Native-NMOS will be described. For example, FIG. 1 is an explanatory diagram for explaining an example of a schematic configuration of the starting circuit according to the comparative example, and illustrates an example of a configuration of a starting circuit 190 in which a current source circuit 200 is a drive target.

As illustrated in FIG. 1, the starting circuit 190 includes a transistor $NM_{10}$ configured as the Native-NMOS, a resistor $R_{STUP}$, and a starting current generation circuit 191. In the transistor $NM_{10}$, a gate terminal is electrically connected to the ground (GND) and a source terminal is electrically connected to the ground (GND) via the resistor $R_{STUP}$. Further, the starting current generation circuit 191 is connected to the side of a drain terminal of the transistor $NM_{10}$. In FIG. 1, reference symbol $I_D$ schematically indicates a drain current of the transistor $NM_{10}$. Further, reference symbol $V_s$ schematically indicates a potential of the source terminal of the transistor $NM_{10}$. With the above configuration, a starting current (starting signal) generated in the starting current generation circuit 191 is transmitted to the current source circuit 200, so that the current source circuit 200 starts.

Specifically, whether or not the starting current generated in the starting current generation circuit 191 is transmitted to the current source circuit 200 is controlled according to either a conductive state in which the source and the drain of the transistor $NM_{10}$ are conductive or a non-conductive state in which the source and the drain are non-conductive. The transistor $NM_{10}$ enters the conductive state, so that the drain current $I_D$ flows through the starting current generation circuit 191, and the starting current is generated by the starting current generation circuit 191. The starting current generated by the starting current generation circuit 191 is transmitted to the current source circuit 200, so that the current source circuit 200 starts.

Here, an example of a circuit configuration of the starting circuit according to the comparative example will be described. For example, FIG. 2 is an explanatory diagram for explaining an example of a circuit configuration of the starting circuit according to the comparative example, and illustrates an example of a circuit configuration of the starting circuit 190 in a case where the current source circuit 200 illustrated in FIG. 1 is configured as a so-called self-bias type current source circuit.

Figure 2:
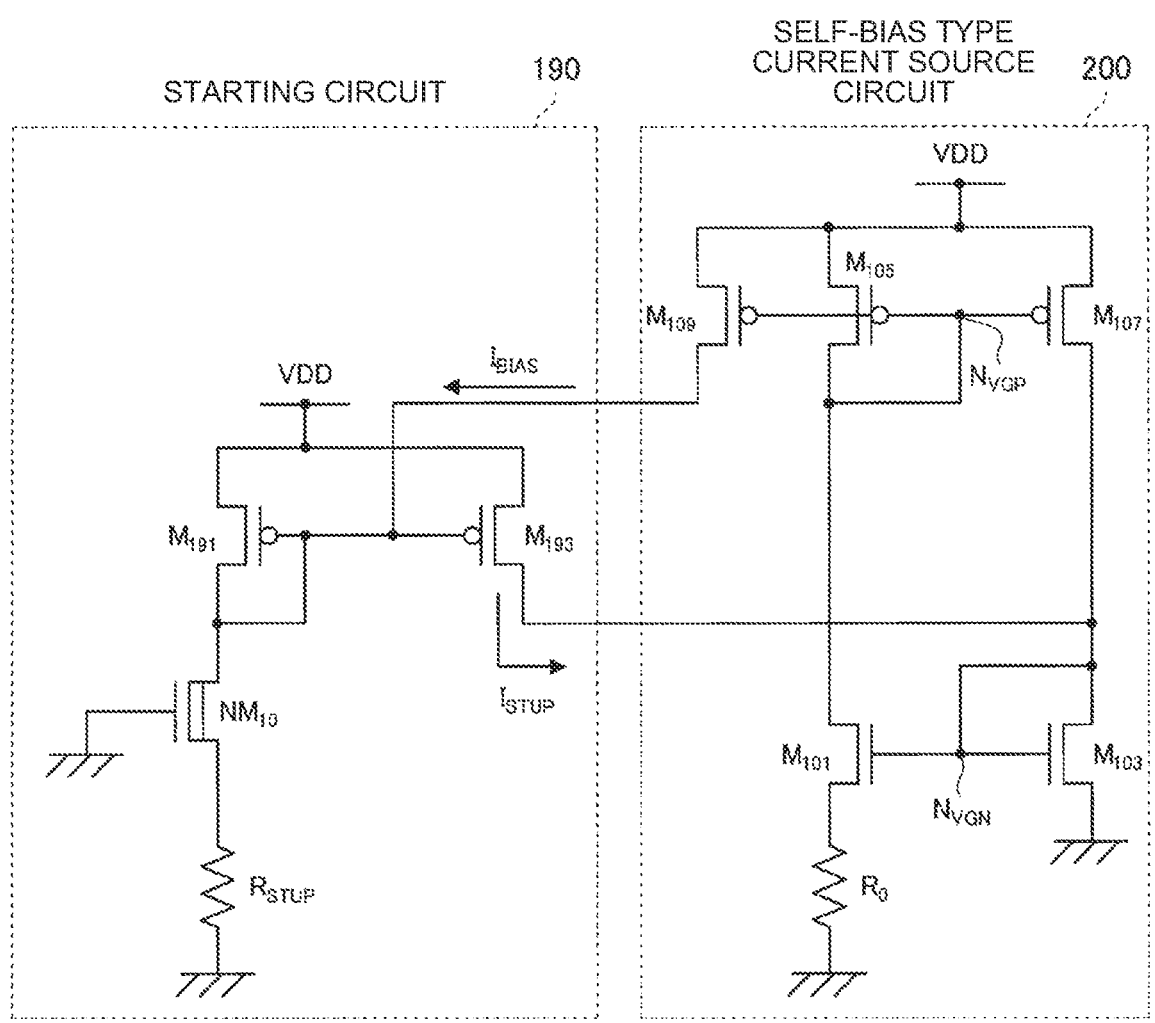
FIG. 2 is an explanatory diagram for explaining an example of a circuit configuration of a starting circuit according to a comparative example.

As described above, the current source circuit 200 illustrated in FIG. 2 is configured as the self-bias type power supply circuit. Specifically, the current source circuit 200 includes transistors $M_{101}$ and $M_{103}$ configured as N-type MOS transistors and transistors $M_{105}$, $M_{107}$, and $M_{109}$ configured as P-type MOS transistors.

The transistors $M_{101}$ and $M_{103}$ configure a current source circuit using a subthreshold characteristic of a MOSFET. Specifically, gate terminals of the transistors $M_{101}$ and $M_{103}$ are electrically connected to each other. A gate and a drain of the transistor $M_{103}$ are electrically connected. A source terminal of the transistor $M_{101}$ is electrically connected to the ground (GND) via a resistor $R_0$. Further, a source terminal of the transistor $M_{103}$ is electrically connected to the ground (GND). As a result, a current having a value obtained by dividing a gate-source voltage difference between the transistors $M_{101}$ and $M_{103}$ by a resistance value of the resistor $R_0$ is generated as a drain current of $M_{101}$.

Further, the transistors $M_{105}$, $M_{107}$, and $M_{109}$ configure a current mirror circuit. Specifically, gate terminals of the transistors $M_{105}$, $M_{107}$, and $M_{109}$ are electrically connected to each other. A gate and a drain of the transistor $M_{105}$ are electrically connected. Source terminals of the transistors $M_{105}$, $M_{107}$, and $M_{109}$ are electrically connected to a power supply voltage $M_{101}$.

Further, the drain terminal of the transistor $M_{101}$ and the drain terminal of the transistor $M_{105}$ are electrically connected. Further, the drain terminal of the transistor $M_{103}$ and the drain terminal of the transistor $M_{107}$ are electrically connected.

With the above configuration, for example, a starting current $I_{STUP}$ generated by the starting circuit 190 is supplied to the side of the drain terminal of the transistor $M_{103}$, and the current source circuit 200 starts. At this time, the starting current $I_{STUP}$ is supplied to the gate terminals of the transistors $M_{101}$ and $M_{103}$ configuring the current source circuit.

Next, a circuit configuration of the starting circuit 190 will be described. The starting circuit 190 includes a transistor $NM_{10}$, a resistor $R_{STUP}$, and transistors $M_{191}$ and $M_{193}$. The transistor $NM_{10}$ corresponds to the transistor $NM_{10}$ illustrated in FIG. 1. That is, the transistor $NM_{10}$ is configured as, for example, a Native-NMOS, and a gate terminal thereof is electrically connected to the ground (GND) and a source terminal thereof is electrically connected to the ground (GND) via the resistor $R_{STUP}$.

The transistors $M_{191}$ and $M_{193}$ configure a current mirror circuit. In a starting circuit 130, a current obtained by replicating a drain current of the transistor $NM_{10}$ by the current mirror circuit is supplied to the current source circuit 200 as the starting current $I_{STUP}$.

Specifically, the transistors $M_{191}$ and $M_{193}$ are configured as P-type MOS transistors and gate terminals thereof are electrically connected to each other. The gate and the drain of the transistor $M_{191}$ are electrically connected. The source terminals of the transistors $M_{191}$ and $M_{193}$ are electrically connected to the power supply voltage VDD. Further, the drain terminal of the transistor $M_{191}$ and the drain terminal of the transistor $NM_{10}$ are electrically connected.

Further, the side of the drain terminal of the transistor $M_{109}$ is electrically connected to the gate terminals of the transistors $M_{191}$ and $M_{193}$ configuring the current mirror circuit. That is, the drain terminal of the transistor $M_{109}$ and the drain terminal of the transistor $NM_{10}$ are electrically connected. Further, the drain terminal of the transistor $M_{193}$ and the drain terminal of the transistor $M_{103}$ (that is, the drain terminal of the transistor $M_{107}$) are electrically connected. That is, the drain terminal of the transistor $M_{193}$ and the gate terminals of the transistors $M_{101}$ and $M_{103}$ configuring the current mirror circuit are electrically connected.

With the above configuration, when the power supply voltage VDD is applied and the starting circuit 190 is turned on, a drain current flows through the transistor $NM_{10}$ in a conductive state, and a current obtained by replicating the drain current by the current mirror circuit of the starting circuit 190 is supplied to the current source circuit 200 as the starting current $I_{STUP}$.

The starting current $I_{STUP}$ from the starting circuit 190 is supplied to the gate terminal (that is, a node $N_{VGN}$) of each of the transistors $M_{101}$ and $M_{103}$ configuring the current source circuit in the current source circuit 200, and the transistors $M_{101}$ and $M_{103}$ transition to the conductive state. As a result, the gate terminal (that is, a node $N_{VGP}$) of each of the transistors $M_{105}$, $M_{107}$, and $M_{109}$ configuring the current mirror circuit is electrically connected to the ground (GND) via the transistor $M_{101}$ and the resistor $R_0$, so that the transistors $M_{105}$, $M_{107}$, and $M_{109}$ configuring the current mirror circuit transition to the conductive state. As described above, with the supply of the starting current $I_{STUP}$ from the starting circuit 190, the current source circuit configured by the N-type MOS transistors $M_{101}$ and $M_{103}$ first starts and the current mirror circuit configured by the P-type MOS transistors $M_{105}$, $M_{107}$, and $M_{109}$ then starts, so that starting of the current source circuit 200 is completed.

Further, when the current source circuit 200 starts, a part of the current output from the current source circuit 200 (in other words, an output signal) is supplied as a bias current $I_{BIAS}$ to the gate terminal of each of the transistors $M_{191}$ and $M_{193}$ configuring the current mirror circuit. As a result, the potential of the gate terminal of each of the transistors $M_{191}$ and $M_{193}$ increase, so that the potential of the drain terminal of the transistor $NM_{10}$ electrically connected to the gate terminal also increases. At this time, a current value of the bias current $I_{BIAS}$ set by an aspect ratio (W/L ratio) of the transistors $M_{105}$ and $M_{109}$ is set to a value sufficiently larger than a current value of the drain current of the transistor $NM_{10}$ to be a value obtained by dividing a gate-source voltage $V_{gs}$ of the transistor $NM_{10}$ by the resistor $R_{STUP}$, so that the drain voltage of the transistor $NM_{10}$ (that is, the gate voltage of each of the transistors $M_{191}$ and $M_{193}$) can be increased to the power supply voltage VDD.

Then, in each of the transistors $M_{191}$ and $M_{193}$, when a gate-source voltage is sufficiently lower than a threshold voltage, each of the transistors $M_{191}$ and $M_{193}$ transitions to a non-conductive state. As described above, the transistor $M_{193}$ transitions to the non-conductive state, so that the supply of the starting current $I_{STUP}$ from the starting circuit 190 to the current source circuit 200 is interrupted. Further, the current value of the bias current $I_{BIAS}$ supplied from the current source circuit 200 to the side of the drain terminal of the transistor $NM_{10}$ at this time is limited to a value substantially equal to the current value of the drain current of the transistor $NM_{10}$, which is a minimum current required to maintain the starting circuit 190 in an off state.

The outline of the starting circuit has been described above with an example with reference to FIGS. 1 and 2.

2. Technical Problems

Next, technical problems of the starting circuit according to the comparative example described above will be described.

Like the starting circuit 190 illustrated in FIG. 1, in the starting circuit of the type using the N-type MOS transistor (that is, the Native-NMOS) whose threshold voltage is near 0 V, the drain current may change according to a variation or a change in the threshold voltage of the MOS transistor. As a specific example, in the starting circuit 190 illustrated in FIG. 1, the drain current $I_D$ of the transistor $NM_{10}$ is given by a formula of a drain current in a subthreshold region of the MOSFET, which is shown as (Formula 1) below.

$$I_D = I_0 \exp\left(\frac{-V_s - V_{th}}{nkT/q}\right) \quad \text{(Formula 1)}$$

In the above (Formula 1), $V_s$ indicates a potential of the source terminal of the transistor $NM_{10}$ whose gate terminal is connected to GND, which is illustrated in FIG. 1. Further, $V_{th}$ indicates a threshold voltage, n indicates a slope factor, k indicates a Boltzmann constant, T indicates a temperature, and q indicates elementary charge. Further, a coefficient $I_0$ is represented by a calculation formula shown as (Formula 2) below.

$$I_0 = \mu C_{ox} \frac{W}{L}(\eta - 1)\left(\frac{kT}{q}\right)^2 \quad \text{(Formula 2)}$$

In the above (Formula 2), μ indicates mobility, $C_{OX}$ indicates capacitance per unit area of a gate oxide film, W indicates a channel width, L indicates a channel length, and η indicates a constant derived from a device structure due to the gate oxide film capacitance and the depletion layer capacitance.

Further, the drain current $I_D$ is represented by a relational expression shown as (Formula 3) below in order to generate the source voltage $V_s$ in the resistor $R_{STUP}$.

$$I_D = V_s \div R_{STUP} \quad \text{(Formula 3)}$$

From the above, the drain current $I_D$ of the transistor $NM_{10}$ is a value solved for $I_D$ by combining the above formulas (1) and (3). It can be seen from (Formula 1) that the drain current $I_D$ includes the threshold voltage $V_{th}$ of the transistor $NM_{10}$ as an argument of an exponential function and is greatly affected by the variation or the change in the threshold voltage $V_{th}$.

Figure 3:
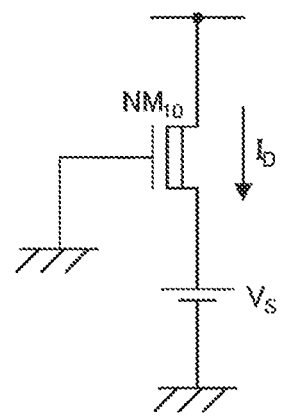
FIG. 3 is an explanatory diagram for explaining an outline of a relation between a source voltage and a drain current of a Native-NMOS whose gate is grounded.

Here, the influence of the variation or the change in the threshold voltage $V_{th}$ will be described numerically. For example, FIG. 3 is an explanatory diagram for explaining an outline of a relation between a source voltage and a drain current of a Native-NMOS whose gate is grounded. A transistor $NM_{10}$ illustrated in FIG. 3 corresponds to the transistor $NM_{10}$ applied to the starting circuit 190 illustrated in FIG. 1. The characteristic of the drain current represented by the above (Formula 1) can be confirmed by sweeping the source voltage $V_s$ and monitoring the drain current $I_D$, in a circuit illustrated in FIG. 3.

Figure 4:
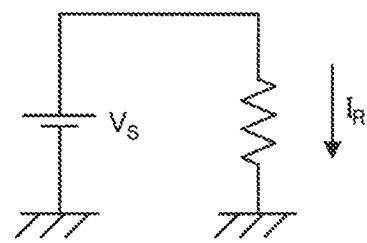
FIG. 4 is an explanatory diagram for explaining an outline of a relation between a resistor to which a voltage is applied and a current flowing through the resistor.

Further, FIG. 4 is an explanatory diagram for explaining an outline of a relation between a resistor to which a voltage is applied and a current flowing through the resistor. In FIG. 4, when the current flowing through the resistor is set to $I_R$, a characteristic of the current flowing through the resistor represented by (Formula 3) described above can be confirmed by sweeping the applied voltage $V_s$ and monitoring the current $I_R$, in a circuit illustrated in FIG. 4.

Figure 5:
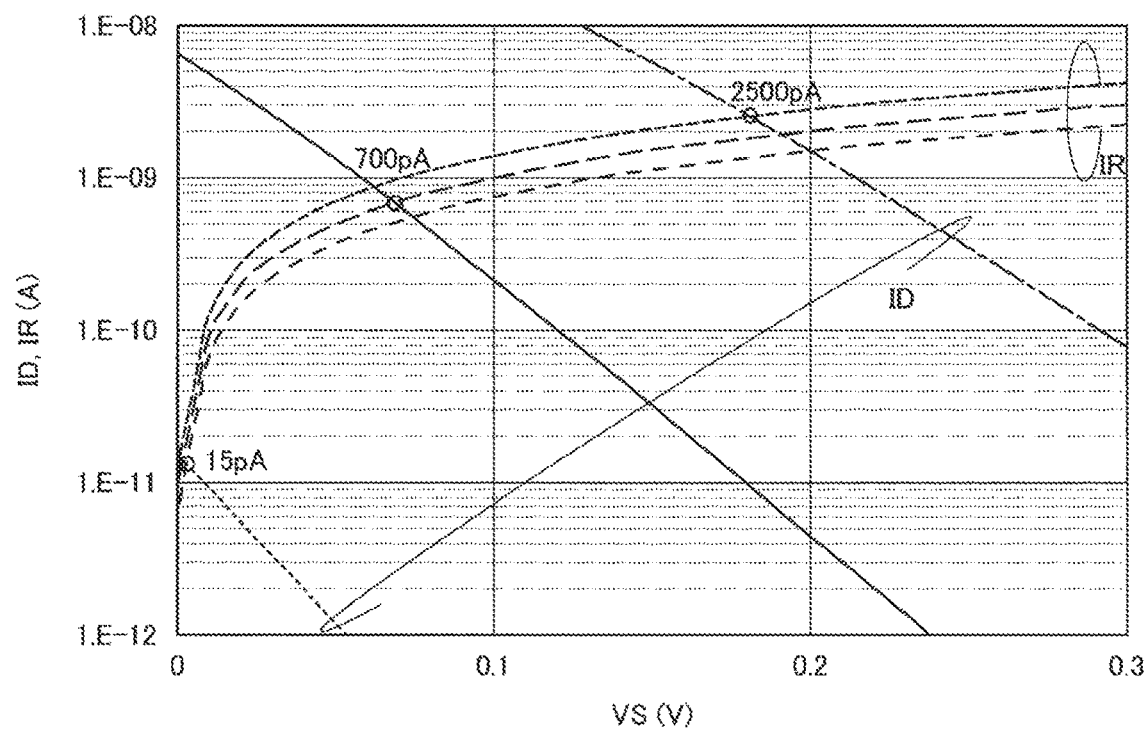
FIG. 5 is an explanatory diagram for explaining characteristics of a starting circuit according to a comparative example.

For example, FIG. 5 is an explanatory diagram for explaining characteristics of a starting circuit according to a comparative example. Specifically, FIG. 5 shows an example of simulation results of the drain current $I_D$ of the Native-NMOS based on the circuit illustrated in FIG. 3 and the current $I_R$ flowing through the resistor based on the circuit illustrated in FIG. 4. In FIG. 5, a horizontal axis represents a voltage value of each of the source voltage $V_s$ illustrated in FIG. 3 and the applied voltage $V_s$ illustrated in FIG. 4. Further, a vertical axis represents a current value of each of the drain current $I_D$ illustrated in FIG. 3 and the current $I_R$ illustrated in FIG. 4. In FIG. 5, a graph shown as reference symbol $I_D$ shows an example of the simulation result of the drain current $I_D$ illustrated in FIG. 3. Further, a graph shown as reference symbol $I_R$ shows an example of the simulation result of the current $I_R$ illustrated in FIG. 4. In the example illustrated in FIG. 5, for each of the drain current $I_D$ illustrated in FIG. 3 and the current $I_R$ illustrated in FIG. 4, simulation results of a maximum value, a representative value, and a minimum value in which a process variation of the threshold voltage $V_{TH}$ of the transistor $NM_{10}$ or a temperature change of the threshold voltage $V_{TH}$ is considered are shown.

As a result of combining the above (Formula 1) and (Formula 3), that is, in FIG. 5, an intersection of the graph of the drain current $I_D$ and the graph of the current $I_R$ corresponding to the same condition becomes the drain current $I_D$ of the transistor $NM_{10}$ in the power supply circuit 190 according to the comparative example illustrated in FIG. 1. As illustrated in FIG. 5, it can be seen that the drain current $I_D$ of the transistor $NM_{10}$ is less affected by the variation in the resistance or the temperature change, but is greatly affected by the variation in the threshold voltage $V_{TH}$ of the transistor $NM_{10}$. More specifically, in the case of the example illustrated in FIG. 5, the drain current $I_D$ of the transistor $NM_{10}$ changes from about 15 pA to about 2500 pA by two digits or more.

As the drain current $I_D$ of the transistor $NM_{10}$ changes, the starting current determined according to the drain current $I_D$ also changes, and the change in the starting current can affect a starting time of a device to be driven (for example, the current source circuit 200 illustrated in FIG. 1). For this reason, for example, when there is a constraint on the starting time of the device to be driven, it is necessary to design a starting circuit so that a maximum value of the starting time that can be assumed is less than a design target. In other words, it is necessary to design the starting circuit so that a minimum value of the drain current $I_D$ of the transistor $NM_{10}$ according to the starting time that can be assumed becomes larger than the design target. On the other hand, an increase in the drain current $I_D$ leads to an increase in current consumption. From the background described above, it is required to introduce technology capable of further suppressing the change in the starting current (in particular, the influence of the variation in the threshold voltage of the transistor $NM_{10}$) in the starting circuit described above.

In view of the above situation, the present disclosure proposes an example of a starting circuit capable of further reducing the influence of the variation in the threshold voltage of the transistor.

3. Technical Features

Technical features of a starting circuit according to an embodiment of the present disclosure will be described below.

3.1. Operation Principle

Figure 6:
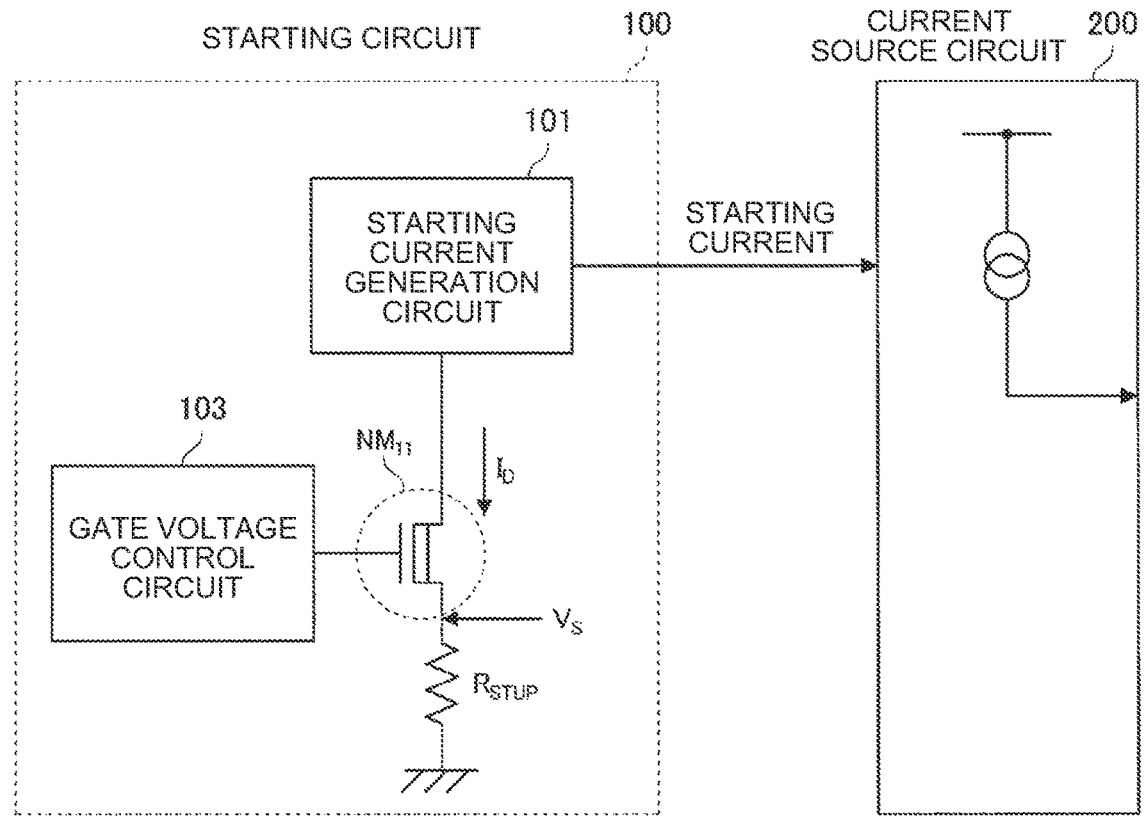
FIG. 6 is an explanatory diagram for explaining an outline of an operation principle of a starting circuit according to an embodiment of the present disclosure.

First, a basic operation principle of the starting circuit according to the embodiment of the present disclosure will be described. For example, FIG. 6 is an explanatory diagram for explaining an outline of the operation principle of the starting circuit according to the embodiment of the present disclosure, and illustrates an example of a configuration in which the starting circuit is abstracted as functional blocks. In the following description, features of a starting circuit 100 according to the embodiment of the present disclosure will be described by focusing on a case where a current source circuit 200 is set to a driving target, similarly to the example described with reference to FIG. 1. That is, since the current source circuit 200 illustrated in FIG. 6 is substantially the same as the current source circuit 200 illustrated in FIG. 1, detailed description thereof will be omitted.

As illustrated in FIG. 6, the starting circuit 100 includes a transistor $NM_{11}$, a resistor $R_{STUP}$, a starting current generation circuit 101, and a gate voltage control circuit 103. Since the starting current generation circuit 101 corresponds to the starting current generation circuit 191 in the example described with reference to FIG. 1, detailed description thereof will be omitted.

The transistor $NM_{11}$ is an N-type MOS transistor whose threshold voltage is adjusted to be near 0 V. In other words, the transistor $NM_{11}$ has a characteristic that a source and a drain are held in a conductive state with a voltage not applied to a gate terminal. As a specific example, the transistor $NM_{11}$ can be configured as a Native-NMOS. The source terminal of the transistor $NM_{11}$ is electrically connected to the ground (GND) via the resistor $R_{STUP}$. Further, the gate voltage control circuit 103 is electrically connected to the gate terminal of the transistor $NM_{11}$, and a gate voltage applied to the transistor $NM_{11}$ is controlled by the gate voltage control circuit 103. Further, the starting current generation circuit 101 is connected to the side of the drain terminal of the transistor $NM_{11}$. Note that the transistor $NM_{11}$ corresponds to an example of a "first MOS transistor".

The gate voltage control circuit 103 controls the gate voltage applied to the transistor $NM_{11}$ (in other words, the potential of the gate terminal of the transistor $NM_{11}$). Specifically, the gate voltage control circuit 103 controls the gate voltage applied to the transistor $NM_{11}$, according to a threshold voltage $V_{TH}$ of the transistor $NM_{11}$. As a more specific example, the gate voltage control circuit 103 performs correction so that the generated drain current $I_D$ becomes larger, when the threshold voltage $V_{TH}$ of the transistor $NM_{11}$ is a predetermined threshold or more (for example, 0 V or more). By the control described above, for example, it is possible to further reduce the influence of the variation in the threshold voltage $V_{TH}$ of the transistor $NM_{11}$ or the change in the threshold voltage $V_{TH}$ due to the temperature change and the like. Details of the above control will be described later together with an example of the circuit configuration of the starting circuit 100.

The basic operation principle of the starting circuit according to the embodiment of the present disclosure has been described above with reference to FIG. 6.

3.2. First Configuration Example

Subsequently, a first configuration example of the starting circuit according to the embodiment of the present disclosure will be described.

(Circuit Configuration)

Figure 7:
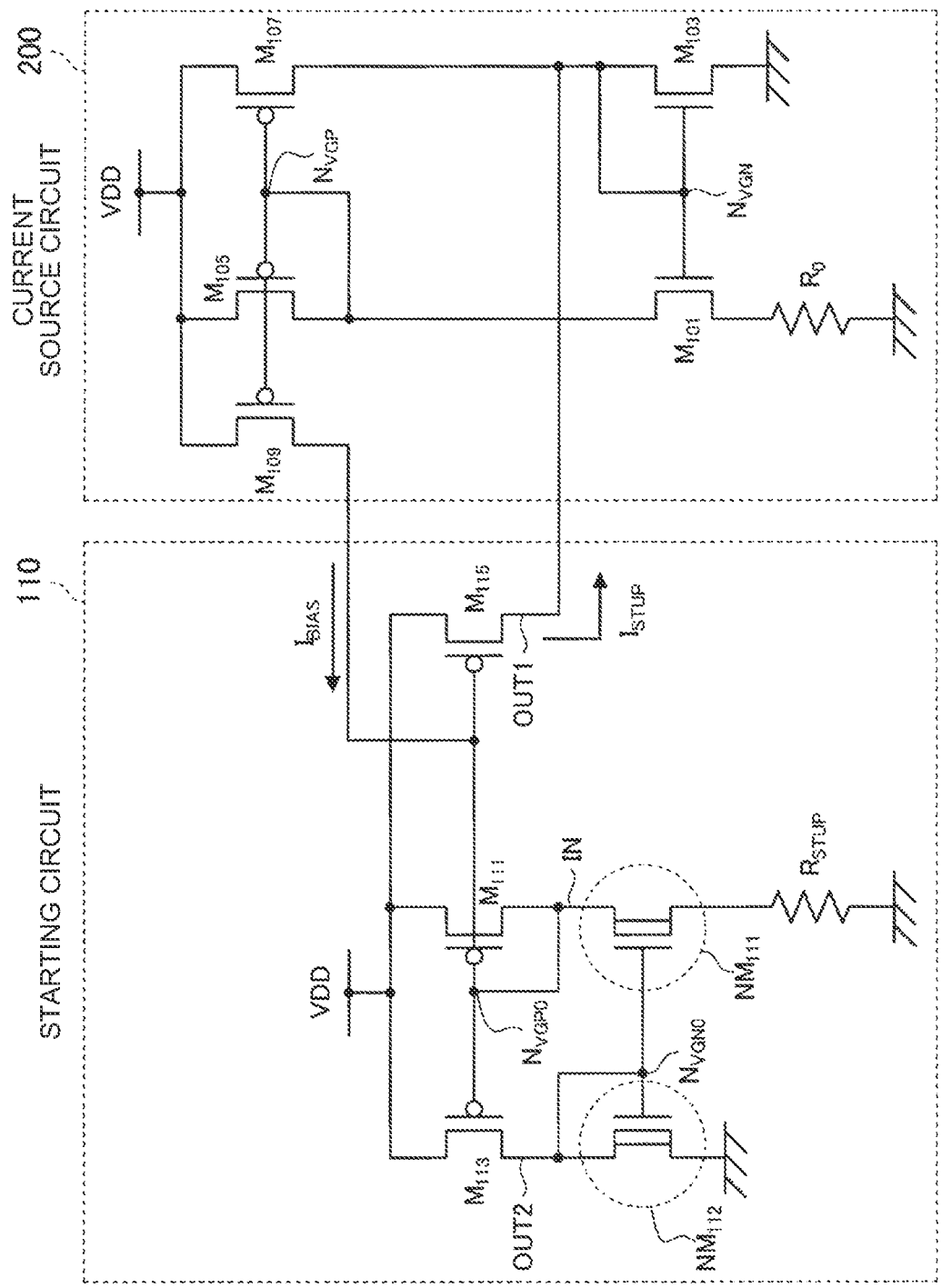
FIG. 7 is an explanatory diagram for explaining a first configuration example of the starting circuit according to the embodiment.

First, an example of a circuit configuration of the starting circuit according to the first configuration example will be described with reference to FIG. 7. FIG. 7 is an explanatory diagram for explaining the first configuration example of the starting circuit according to the embodiment of the present disclosure, and illustrates an example of the circuit configuration of the starting circuit illustrated in FIG. 6. Since the circuit configuration of a current source circuit 200 illustrated in FIG. 7 is substantially the same as the circuit configuration of the current source circuit 200 described with reference to FIG. 2, detailed description thereof will be omitted. Further, a starting circuit 110 illustrated in FIG. 7 corresponds to the example of the starting circuit 100 in the example illustrated in FIG. 6.

As illustrated in FIG. 7, the starting circuit 110 includes transistors $NM_{111}$ and $NM_{113}$, a resistor $R_{STUP}$, and transistors $M_{111}$, $M_{113}$, and Min. Each of the transistors $NM_{111}$ and $NM_{113}$ is configured as an N-type MOS transistor whose threshold voltage is adjusted to be near 0 V. In other words, each of the transistors $NM_{111}$ and $NM_{113}$ has a characteristic that a source and a drain are held in a conductive state with a voltage not applied to a gate terminal. As a specific example, each of the transistors $NM_{111}$ and $NM_{113}$ can be configured as a Native-NMOS. Note that the transistor $NM_{111}$ and the resistor $R_{STUP}$ correspond to the transistor $NM_{11}$ and the resistor $R_{STUP}$ illustrated in FIG. 6. That is, the source terminal of the transistor $NM_{111}$ is electrically connected to the ground (GND) via the resistor $R_{STUP}$. Further, the transistors $M_{111}$, $M_{113}$, and $M_{115}$ and the transistor $NM_{113}$ function as the starting current generation circuit 101 and the gate voltage control circuit 103 illustrated in FIG. 6. More specifically, particularly, the transistor $NM_{113}$ contributes to the role of the gate voltage control circuit 103.

The gate terminal and the drain terminal of the transistor $NM_{113}$ are electrically connected (that is, diode-connected), and the gate terminal thereof is electrically connected to the gate terminal of the transistor $NM_{111}$. Further, the source terminal of the transistor $NM_{113}$ is electrically connected to the ground (GND). Note that the transistor $NM_{113}$ corresponds to an example of a "second MOS transistor".

The transistors $M_{111}$, $M_{113}$, and $M_{115}$ configure a current mirror circuit. Specifically, the transistors $M_{111}$, $M_{113}$, and $M_{115}$ are configured as P-type MOS transistors and gate terminals thereof are electrically connected to each other. The gate terminal and the drain terminal of the transistor $M_{111}$ are electrically connected (that is, diode-connected). The source terminals of the transistors $M_{111}$, $M_{113}$, and $M_{115}$ are electrically connected to the power supply voltage VDD. With the above configuration, the drain terminal of the transistor $M_{111}$ and the drain terminal of the transistor $NM_{111}$ are electrically connected. Further, the drain terminal of the transistor $M_{113}$ and the drain terminal of the transistor $NM_{113}$ are electrically connected.

Further, the side of the drain terminal of the transistor $M_{109}$ is electrically connected to the gate terminal of each of the transistors $M_{111}$, $M_{113}$, and $M_{115}$ configuring the current mirror circuit. That is, the drain terminal of the transistor $M_{109}$ and the drain terminal of the transistor $NM_{111}$ are electrically connected. Further, the drain terminal of the transistor $M_{115}$ and the drain terminal of the transistor $M_{103}$ (that is, the drain terminal of the transistor $M_{107}$) are electrically connected. That is, the drain terminal of the transistor $M_{115}$ and the gate terminal of each of the transistors $M_{101}$ and $M_{103}$ configuring the current mirror circuit in the current source circuit 200 are electrically connected.

Note that, in the following description, for convenience, a terminal indicated by reference symbol IN in FIG. 7, that is, the drain terminal of the transistor $M_{111}$ is also referred to as an "input terminal IN" of the current mirror circuit configured by the transistors $M_{111}$, $M_{113}$, and $M_{115}$. Further, in FIG. 7, terminals indicated by reference symbols OUT1 and OUT2, that is, the drain terminal of the transistor Mus and the drain terminal of the transistor $M_{113}$ are also referred to as a "first output terminal OUT1" and a "second output terminal OUT2" of the current mirror circuit, respectively. In addition, in the starting circuit 110 according to the first configuration example, the transistors $M_{111}$, $M_{113}$, and $M_{115}$ correspond to examples of a "third MOS transistor", a "fourth MOS transistor", and a "fifth MOS transistor", respectively.

With the above configuration, when the power supply voltage VDD is applied and the starting circuit 110 is turned on, a current output from the input terminal IN of the current mirror circuit flows through the transistor $NM_{111}$ in a conductive state. As a result, a current obtained by replicating the drain current of the transistor $NM_{111}$ (that is, the current output from the input terminal IN) by the current mirror circuit is supplied as a starting current $I_{STUP}$ from the first output terminal OUT1 of the current mirror circuit to the current source circuit 200. That is, the current source circuit 200 starts in response to the supply of the starting current $I_{STUP}$. Note that the drain current of the transistor $NM_{111}$ corresponds to an example of a "second current", and the starting current $I_{STUP}$ corresponds to an example of a "first current".

At this time, a current obtained by replicating the drain current of the transistor $NM_{111}$ by the current mirror circuit flows through the transistor $NM_{113}$ in the conductive state from the second output terminal OUT2 of the current mirror circuit. That is, the current output from the second output terminal OUT2 is supplied to the gate terminal of each of the transistors $NM_{111}$ and $NM_{113}$ according to the threshold voltage $V_{TH}$ of the transistor $NM_{113}$, and the drain current flowing through the transistor $NM_{111}$ is controlled. Details of the above control will be described later. Further, the current flowing through the transistor $NM_{113}$, which is the replication of the drain current of the transistor $NM_{111}$, corresponds to an example of a "third current".

Next, when the current source circuit 200 starts, a part of the current (in other words, the output signal) output from the current source circuit 200 is supplied as the bias current $I_{BIAS}$ to the gate terminal of each of the transistors $M_{111}$, $M_{113}$, and $M_{115}$ configuring the current mirror circuit. As a result, the potential of the gate terminal of each of the transistors $M_{111}$, $M_{113}$, and $M_{115}$ increases, so that the potential of the drain terminal of the transistor $NM_{111}$ electrically connected to the gate terminal also increases. At this time, a current value of the bias current $I_{BIAS}$ set by an aspect ratio (W/L ratio) of the transistors $M_{105}$ and $M_{109}$ is set to a value sufficiently larger than a current value of the drain current of the transistor $NM_{111}$ to be a value obtained by dividing a gate-source voltage $V_{gs}$ of the transistor $NM_{111}$ by the resistor $R_{STUP}$, so that the drain voltage of the transistor $NM_{111}$ (that is, the gate voltage of each of the transistors $M_{111}$, $M_{113}$, and $M_{115}$) can be increased to the power supply voltage VDD. Note that the bias current $I_{BIAS}$ corresponds to an example of a "fourth current".

Then, in each of the transistors $M_{111}$, $M_{113}$, and $M_{115}$, when a gate-source voltage is sufficiently lower than a threshold voltage, each of $M_{111}$, $M_{113}$, and $M_{115}$ transitions to a non-conductive state. As described above, the transistor $M_{115}$ transitions to the non-conductive state, so that the supply of the starting current $I_{STUP}$ from the starting circuit 110 to the current source circuit 200 is interrupted. Further, the current value of the bias current $I_{BIAS}$ supplied from the current source circuit 200 to the side of the drain terminal of the transistor $NM_{111}$ at this time is limited to a value substantially equal to the current value of the drain current of the transistor $NM_{111}$, which is a minimum current required to maintain the starting circuit 110 in an off state.

(Operation)

Figure 8:
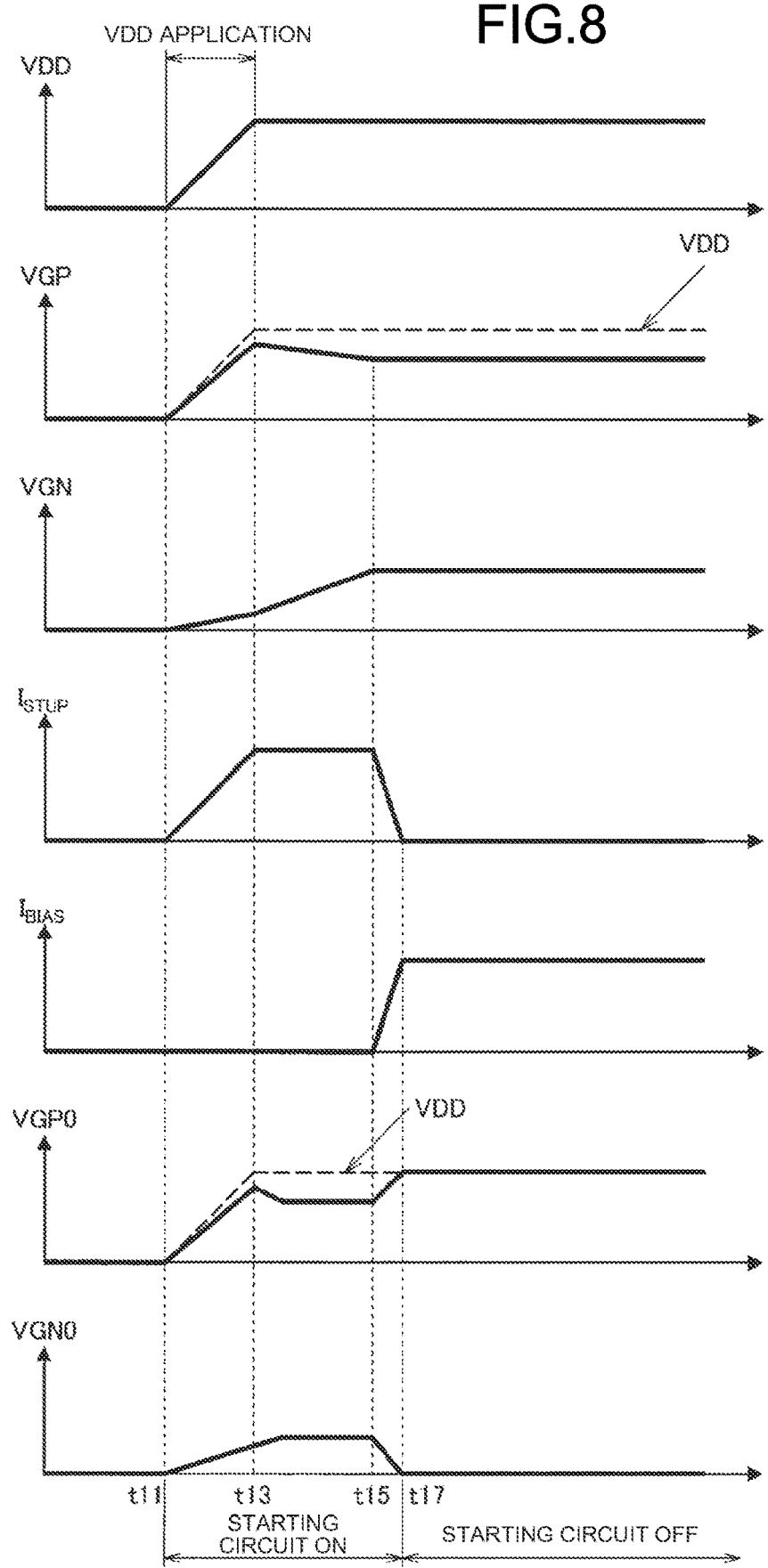
FIG. 8 is a timing chart for explaining an operation of the starting circuit according to the first configuration example.

Here, an operation of the starting circuit 110 illustrated in FIG. 7, that is, an operation related to the starting of the current source circuit 200 will be described in more detail with reference to FIG. 8. FIG. 8 is a timing chart for explaining an operation of the starting circuit 110 according to the first configuration example. A horizontal axis of FIG. 8 indicates a time. VDD indicates a voltage value of the power supply voltage VDD illustrated in FIG. 7. VGP indicates the potential of the node $N_{VGP}$ in FIG. 7, that is, the potential of the gate terminal of each of the transistors $M_{105}$, $M_{107}$, and $M_{109}$ configuring the current mirror circuit in the current source circuit 200. VGN indicates the potential of the node $N_{VGN}$ in FIG. 7, that is, the potential of the gate terminal of each of the transistors $M_{101}$ and $M_{103}$ configuring the current mirror circuit in the current source circuit 200. $I_{STUP}$ indicates a current value of the starting current $I_{STUP}$ illustrated in FIG. 7. $I_{BIAS}$ indicates a current value of the bias current $I_{BIAS}$ illustrated in FIG. 7. VGP0 indicates the potential of the node $N_{VGP0}$ in FIG. 7, that is, the potential of the gate terminal of each of the transistors $M_{111}$, $M_{113}$, and $M_{115}$ configuring the current mirror circuit in the starting circuit 110. VGN0 indicates the potential of the node $N_{VGN0}$ in FIG. 7, that is, the potential of the gate terminal of each of the transistors $NM_{111}$ and $NM_{113}$.

In the example illustrated in FIG. 8, the power supply voltage VDD is applied at the timing t11, and the voltage value of the power supply voltage VDD increases in a period from the timing t11 to the timing t13.

When the power supply voltage VDD is applied, the starting circuit 110 is turned on, and the drain current flows from the input terminal IN to the transistor $NM_{111}$ in a conductive state. As a result, a current obtained by replicating the drain current by the current mirror circuit is supplied as the starting current $I_{STUP}$ from the first output terminal OUT1 to the current source circuit 200. Further, the current obtained by replicating the drain current by the current mirror circuit flows through the side of the drain terminal of the transistor $NM_{113}$ from the second output terminal OUT2. As described above, the gate terminal and the drain terminal of the transistor $NM_{113}$ are electrically connected, and the current flowing through the side of the drain terminal of the transistor $NM_{113}$ is supplied to the node $N_{VGN0}$ (that is, the gate terminal of each of the transistors $NM_{111}$ and $NM_{113}$). With the above configuration, the gate voltage of each of the transistors $NM_{111}$ and $NM_{113}$ (that is, the potential of the node $N_{VGN0}$) is controlled to a voltage according to the threshold voltage of the transistor $NM_{113}$.

Specifically, when the threshold voltage of the transistor $NM_{111}$ is 0 V or less, the current value of the starting current $I_{STUP}$ is determined by the gate-source voltage of the transistor $NM_{111}$ when the gate voltage of the transistor $NM_{111}$ is set to 0 V. At this time, the threshold voltage is 0 V or less. For this reason, even if a current obtained by replicating the drain current of the transistor $NM_{111}$ flows through the transistor $NM_{113}$, the gate voltage does not become 0 V or more.

On the other hand, in a case where the threshold voltage is higher than 0 V, if a current obtained by replicating the drain current of the transistor $NM_{111}$ flows through the transistor $NM_{113}$, the transistor $NM_{113}$ is diode-connected, so that the gate voltage of each of the transistors $NM_{111}$ and $NM_{113}$ becomes higher than 0 V. By the above effect, the current value of the drain current of the transistor $NM_{111}$ becomes larger than that when the gate voltage of the transistor $NM_{111}$ is 0 V.

As a specific example, in the example illustrated in FIG. 8, as the voltage value of the power supply voltage VDD increases, a current value of each of the drain current of the transistor $NM_{111}$ and a current obtained by replicating the drain current (that is, the starting current $I_{STUP}$ and the drain current of the transistor $NM_{113}$) increases.

The starting current $I_{STUP}$ from the starting circuit 110 is supplied to the gate terminal (that is, the node $N_{VGN}$) of each of the transistors $M_{101}$ and $M_{103}$ configuring the current mirror circuit in the current source circuit 200, and the transistors $M_{101}$ and $M_{103}$ transition to the conductive state. As a result, the gate terminal (that is, the node $N_{VGP}$) of each of the transistors $M_{105}$, $M_{107}$, and $M_{109}$ configuring the current mirror circuit in the current source circuit 200 is electrically connected to the ground (GND) via the transistor $M_{101}$ and the resistor $R_0$, and the potential of the node $N_{VGP}$ decreases in accordance with the increase in the potential VGN of the node $N_{VGN}$. Then, as the potential VGP of the node $N_{VGP}$ decreases, at the timing t17, the transistors $M_{105}$, $M_{107}$, and $M_{109}$ configuring the current mirror circuit transition to the conductive state, and the increase in the potential VGN and the decrease in the potential VGP are stopped. As described above, the starting of the current source circuit 200 is completed, and a signal (drain current) flows between the source and the drain of each of the transistors $M_{101}$, $M_{103}$, $M_{105}$, $M_{107}$, and $M_{109}$ configuring the current source circuit 200.

Further, as the power supply voltage VDD is applied, a current flows through the resistor $R_{STUP}$ via the transistors $M_{111}$ and $NM_{111}$. At this time, since the gate and the drain of the transistor $M_{111}$ are electrically connected, the potential VGP0 of the node $N_{VGP0}$ (that is, the gate voltage of each of the transistors $M_{111}$ and $M_{113}$) also increases as the power supply voltage VDD increases. As a specific example, in the example illustrated in FIG. 8, the potential VGP0 of the node $N_{VGP0}$ increases during the period of the timings t11 to t13.

Further, a current obtained by replicating the current flowing through the transistor $M_{111}$ (that is, the current output from the input terminal IN) by the current mirror circuit flows through the side of the drain terminal of the transistor $NM_{113}$ from the second output terminal OUT. At this time, as described above, when the threshold voltage of the transistor $NM_{111}$ is higher than 0 V, the transistor $NM_{113}$ is diode-connected, so that the potential VGN0 of the node $N_{VGN0}$ (that is, the gate voltage of each of the transistors $NM_{111}$ and $NM_{113}$) becomes higher than 0 V. As a specific example, in the example illustrated in FIG. 8, the potential VGN0 of the node $N_{VGN0}$ increases during the period of the timings t11 to t15. That is, the current value of the drain current of the transistor $NM_{111}$ also increases as the gate voltage of the transistor $NM_{111}$ increases. On the other hand, the increase in the potential of the power supply voltage VDD is stopped at the timing t13, and in the period of the timings t13 to t15, the potential VGP0 of the node $N_{VGP0}$ decreases as the potential VGN0 of the node $N_{VGN0}$ increases (that is, the current value of the drain current of the transistor $NM_{111}$ increases).

Further, when the starting of the current source circuit 200 is completed at the timing t17, the current (signal) transmitted between the source and the drain of the transistor $M_{109}$ is supplied as the bias current $I_{BIAS}$ to the gate terminal (that is, the node $N_{VGP0}$) of each of the transistors $M_{111}$, $M_{113}$, and $M_{115}$ configuring the current mirror circuit in the starting circuit 110. As a result, the potential of the gate terminal of each of the transistors $M_{111}$, $M_{113}$, and $M_{115}$ increases, so that the potential of the drain terminal of the transistor $NM_{111}$ electrically connected to the gate terminal also increases. At this time, a current value of the bias current $I_{BIAS}$ set by an aspect ratio (W/L ratio) of the transistors $M_{105}$ and $M_{109}$ is set to a value sufficiently larger than a current value of the drain current of the transistor $NM_{111}$ to be a value obtained by dividing a gate-source voltage $V_{gs}$ of the transistor $NM_{111}$ by the resistor $R_{STUP}$, so that the drain voltage of the transistor $NM_{111}$ (that is, the gate voltage of each of the transistors $M_{111}$, $M_{113}$, and $M_{115}$) can be increased to the power supply voltage VDD. Specifically, in the example illustrated in FIG. 8, during a period of the timings t17 to t19, as the current value of the bias current $I_{BIAS}$ increases, the potential VPG0 of the node $N_{VGP0}$ (that is, the gate voltage of each of the transistors $M_{111}$, $M_{113}$, and $M_{115}$) increases.

Then, in each of the transistors $M_{111}$, $M_{113}$, and $M_{115}$, when the gate-source voltage is sufficiently lower than the threshold voltage, each of the transistors $M_{111}$, $M_{113}$, and $M_{115}$ transitions to the non-conductive state. As described above, the transistor $M_{115}$ transitions to the non-conductive state, so that the supply of the starting current $I_{STUP}$ from the starting circuit 110 to the current source circuit 200 is interrupted. Further, the transistor $M_{111}$ transitions to the non-conductive state, so that the inflow of the current from the input terminal IN to the side of the drain terminal of the transistor $M_{111}$ is also limited. Similarly, the transistor $M_{113}$ transitions to the non-conductive state, so that the inflow of the current from the second output terminal OUT2 to the side of the drain terminal of the transistor $M_{113}$ is also limited. Therefore, in the example illustrated in FIG. 8, during the period of the timings t17 to t19, as the potential VGP0 of the node $N_{VGP0}$ increases, the potential VGN0 of the node $N_{VGN0}$ decreases.

In this way, after the timing t19, the starting circuit 110 transitions to an off state. Note that the current value of the bias current $I_{BIAS}$ supplied from the current source circuit 200 to the side of the drain terminal of the transistor $NM_{111}$ at this time is limited to a value substantially equal to the current value of the drain current of the transistor $NM_{111}$, which is a minimum current required to maintain the starting circuit 110 in an off state.

Embodiment

Figure 9:
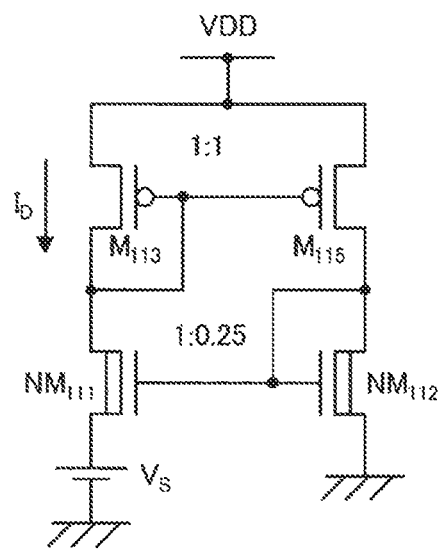
FIG. 9 is an explanatory diagram for explaining characteristics of the starting circuit according to the first configuration example.

Next, as an embodiment of the first configuration example, characteristics of the starting circuit according to the first configuration example will be described with reference to FIGS. 9 and 10. FIG. 9 is an explanatory diagram for explaining the characteristics of the starting circuit according to the first configuration example, and illustrates an example of a circuit for simulating the characteristic of the transistor $NM_{111}$ self-biased, in the starting circuit 110 illustrated in FIG. 7. The transistors $NM_{111}$, $NM_{113}$, $M_{111}$, and $M_{113}$ in FIG. 9 correspond to the transistors $NM_{111}$, $NM_{113}$, $M_{111}$, and $M_{113}$ in the starting circuit 110 illustrated in FIG. 7, respectively. Further, a DC power supply $V_s$ illustrated in FIG. 9 imitates the source voltage of the transistor $NM_{111}$. Note that, in the example illustrated in FIG. 9, a size ratio between the transistor $NM_{111}$ and the transistor $NM_{113}$ is adjusted so that the voltage is more likely to be generated on the side of the transistor $NM_{113}$. Specifically, in the example illustrated in FIG. 9, the size ratio between the transistor $NM_{111}$ and the transistor $NM_{113}$ is 1:0.25.

In the circuit illustrated in FIG. 9, by sweeping the source voltage $V_s$ of the transistor $NM_{111}$ and monitoring the drain current $I_D$ of the transistor $NM_{111}$, the characteristic of the drain current of the transistor $NM_{111}$ can be confirmed. Further, as described above with reference to FIG. 4, the characteristic of the current $I_R$ flowing through the resistor (that is, the characteristic of the current represented by (Formula 3) described above) can be confirmed by sweeping the applied voltage $V_S$ and monitoring the current $I_R$ in the circuit illustrated in FIG. 4.

Figure 10:
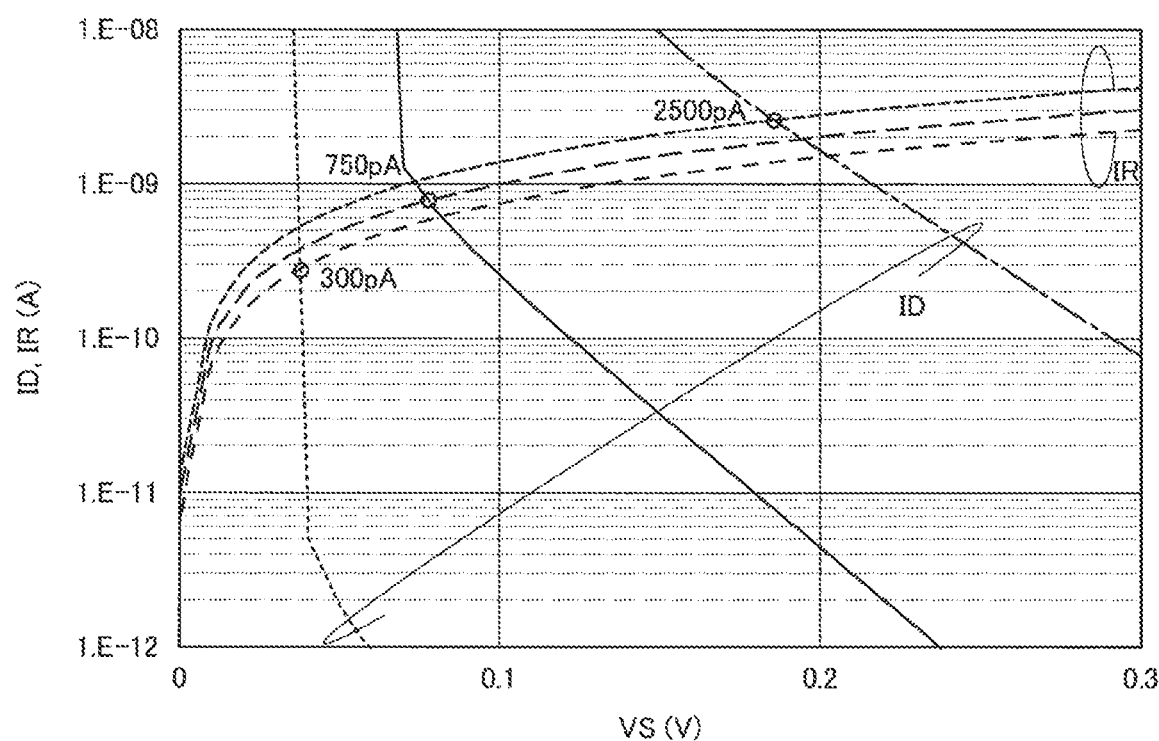
FIG. 10 is an explanatory diagram for explaining characteristics of the starting circuit according to the first configuration example.

For example, FIG. 10 is an explanatory diagram for explaining characteristics of the starting circuit according to the first configuration example. Specifically, FIG. 10 shows an example of simulation results of the drain current $I_D$ of the transistor $NM_{111}$ based on the circuit illustrated in FIG. 9 and the current $I_R$ flowing through the resistor based on the circuit illustrated in FIG. 4. In FIG. 10, a horizontal axis represents a voltage value of each of the source voltage $V_s$ illustrated in FIG. 9 and the applied voltage $V_s$ illustrated in FIG. 4. Further, a vertical axis represents a current value of each of the drain current $I_D$ illustrated in FIG. 9 and the current $I_R$ illustrated in FIG. 4. In FIG. 10, a graph shown as reference symbol $I_D$ shows an example of the simulation result of the drain current $I_D$ illustrated in FIG. 9. Further, a graph shown as reference symbol $I_R$ shows an example of the simulation result of the current $I_R$ illustrated in FIG. 4. Note that, in the example illustrated in FIG. 10, for each of the drain current $I_D$ illustrated in FIG. 9 and the current $I_R$ illustrated in FIG. 4, simulation results of a maximum value, a representative value, and a minimum value in which a process variation of the threshold voltage $V_{TH}$ of the transistor $NM_{111}$ or a temperature change of the threshold voltage $V_{TH}$ is considered are shown.

In FIG. 10, an intersection of the graph of the drain current $I_D$ and the graph of the current $I_R$ corresponding to the same condition becomes the drain current $I_D$ of the transistor $NM_{111}$ in the power supply circuit 110 according to the first configuration example illustrated in FIG. 9. Note that, in the power supply circuit 110 illustrated in FIG. 9, a current obtained by replicating the drain current $I_D$ of the transistor $NM_{111}$ by the current mirror circuit is supplied as the starting current $I_{STUP}$ to a device to be started (for example, the current source circuit 200). That is, the drain current $I_D$ of the transistor $NM_{111}$ derived on the basis of FIG. 10 corresponds to the current value of the starting current $I_{STUP}$ supplied from the power supply circuit 110 to the current source circuit 200 in the example illustrated in FIG. 9.

Here, when the characteristics of the starting circuit according to the first configuration example illustrated in FIG. 10 and the characteristics of the starting circuit according to the comparative example illustrated in FIG. 5 are compared, both the maximum values of the starting currents are 2500 pA. On the other hand, the minimum value of the starting current is 15 pA in the starting circuit according to the comparative example, whereas it is 300 pA in the starting circuit according to the first configuration example. Further, the representative value of the starting current is 700 pA in the starting circuit according to the comparative example, whereas it is 750 pA in the starting circuit according to the first configuration example. As described above, the starting circuit according to the first configuration example has a smaller change width of the drain current $I_D$ (in other words, the change width of the starting current) than the starting circuit according to the comparative example. From this, it can be seen that the starting circuit according to the first configuration example is more suppressed in the influence of the variation in the threshold voltage $V_{TH}$ of the transistor $NM_{111}$ than the starting circuit according to the comparative example.

As described above, according to the starting circuit according to the embodiment of the present disclosure, the influence of the variation in the threshold voltage $V_{TH}$ of the transistor (for example, the transistor $NM_{111}$ illustrated in FIG. 7) configuring the starting circuit can be further reduced, and the change in the source voltage or the drain current can be further suppressed. That is, by applying the starting circuit, the change of the starting current can be further suppressed as compared with the starting circuit according to the comparative example described above. Therefore, for example, the change in the starting time of the device to be driven (for example, the current source circuit 200 illustrated in FIG. 7) can be further suppressed. In particular, in the case of the conventional starting circuit, when there is a constraint on the starting time, it is necessary to perform designing so that the maximum value of the starting time is less than the design target. In other words, it is necessary to perform designing with a margin so that the minimum value of the drain current of the transistor configuring the starting circuit is larger than the design target. On the other hand, since the starting circuit according to the embodiment of the present disclosure can suppress the change of the drain current as described above, for example, as compared with the conventional starting circuit, it is possible to suppress an increase in the current consumption according to a design considering the margin according to the change in the drain current, and it is possible to limit a design value (representative value) of the current consumption to a smaller value.

The first configuration example of the starting circuit according to the embodiment of the present disclosure has been described above with reference to FIGS. 7 to 10.

3.3. Second Configuration Example

Figure 11:
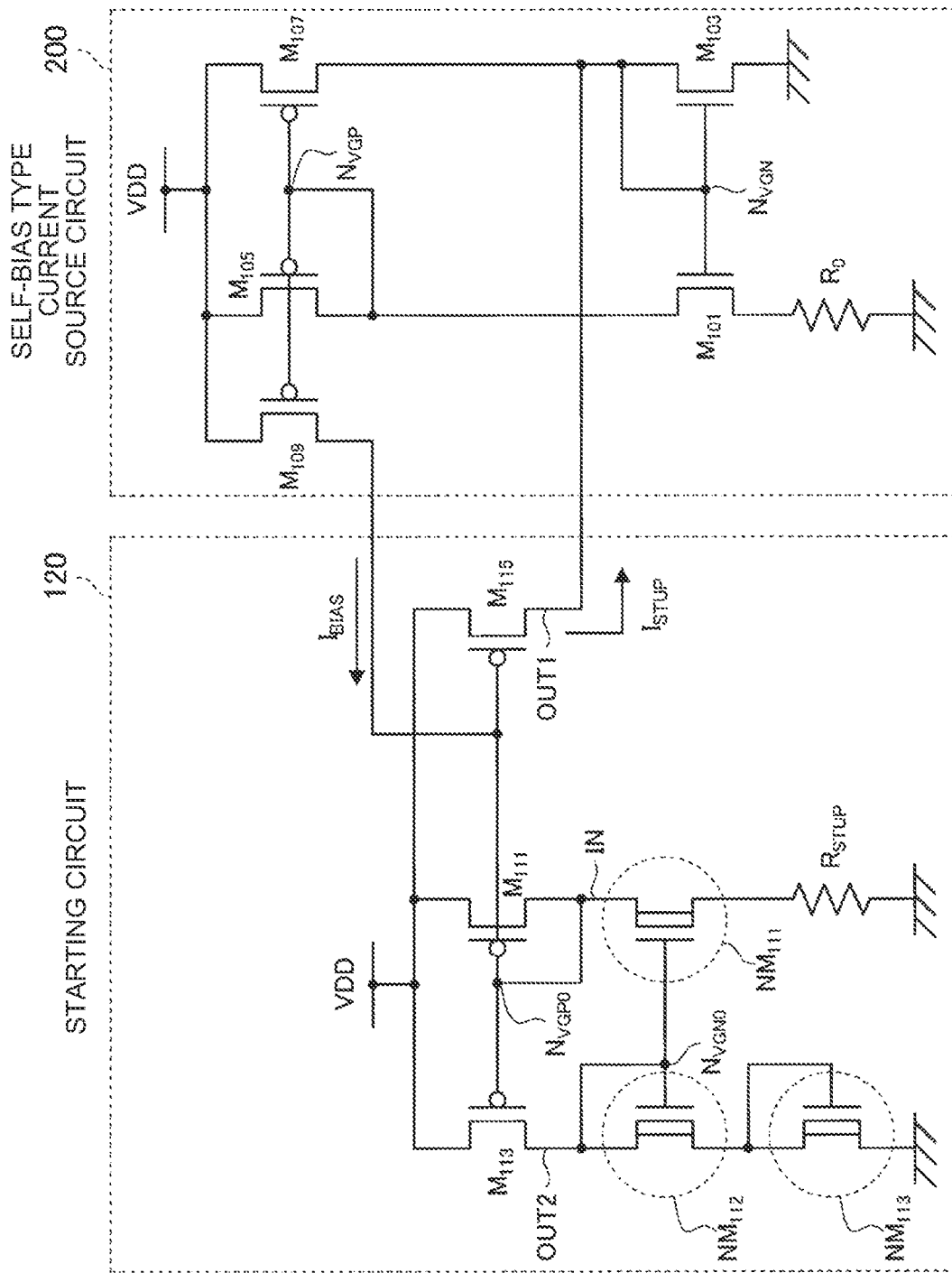
FIG. 11 is an explanatory diagram for explaining a second configuration example of the starting circuit according to the embodiment.

Subsequently, a second configuration example of the starting circuit according to the embodiment of the present disclosure will be described. For example, FIG. 11 is an explanatory diagram for explaining the second configuration example of the starting circuit according to the embodiment of the present disclosure, and illustrates another example of the circuit configuration of the starting circuit illustrated in FIG. 6. Since a circuit configuration of a current source circuit 200 illustrated in FIG. 11 is substantially the same as the circuit configuration of the current source circuit 200 described with reference to FIG. 2, detailed description thereof will be omitted. Further, a starting circuit 120 illustrated in FIG. 11 corresponds to the example of the starting circuit 100 in the example illustrated in FIG. 6.

As illustrated in FIG. 11, the starting circuit 120 according to the second configuration example is different from the starting circuit 110 according to the first configuration example described with reference to FIG. 9 in that the starting circuit 120 includes a transistor $NM_{115}$, and the other configuration is substantially the same as that of the starting circuit 110. Therefore, in the following description, the starting circuit 120 according to the second configuration example will be described, particularly focusing on a part different from the starting circuit 110 according to the first configuration example, and detailed description of substantially the same part as that of the starting circuit 110 will be omitted.

As illustrated in FIG. 11, in the starting circuit 120, the transistor $NM_{115}$ is interposed between the side of the source terminal of the transistor $NM_{113}$ of which the gate terminal and the drain terminal are electrically connected (that is, diode-connected) and the ground. The drain terminal of the transistor $NM_{115}$ is electrically connected to the source terminal of the transistor $NM_{113}$, and the source terminal thereof is electrically connected to the ground. Further, in the transistor $NM_{115}$, the gate terminal and the drain terminal are electrically connected (that is, diode-connected).

Like the transistors $NM_{111}$ and $NM_{113}$, the transistor $NM_{115}$ is configured as an N-type MOS transistor whose threshold voltage is adjusted to be near 0 V. In other words, the transistor $NM_{115}$ has a characteristic that the source and the drain are held in a conductive state with a voltage not applied to the gate terminal. As a specific example, the transistor $NM_{115}$ can be configured as a Native-NMOS. Note that the transistor $NM_{115}$ corresponds to an example of a "sixth MOS transistor".

With the above configuration, according to the starting circuit 120 according to the second configuration example, when the threshold voltage of the transistor $NM_{111}$ is 0 V or more, it is possible to generate a higher gate voltage for the transistor $NM_{111}$.

The second configuration example of the starting circuit according to the embodiment of the present disclosure has been described above with reference to FIG. 11.

3.4. Third Configuration Example

Figure 12:
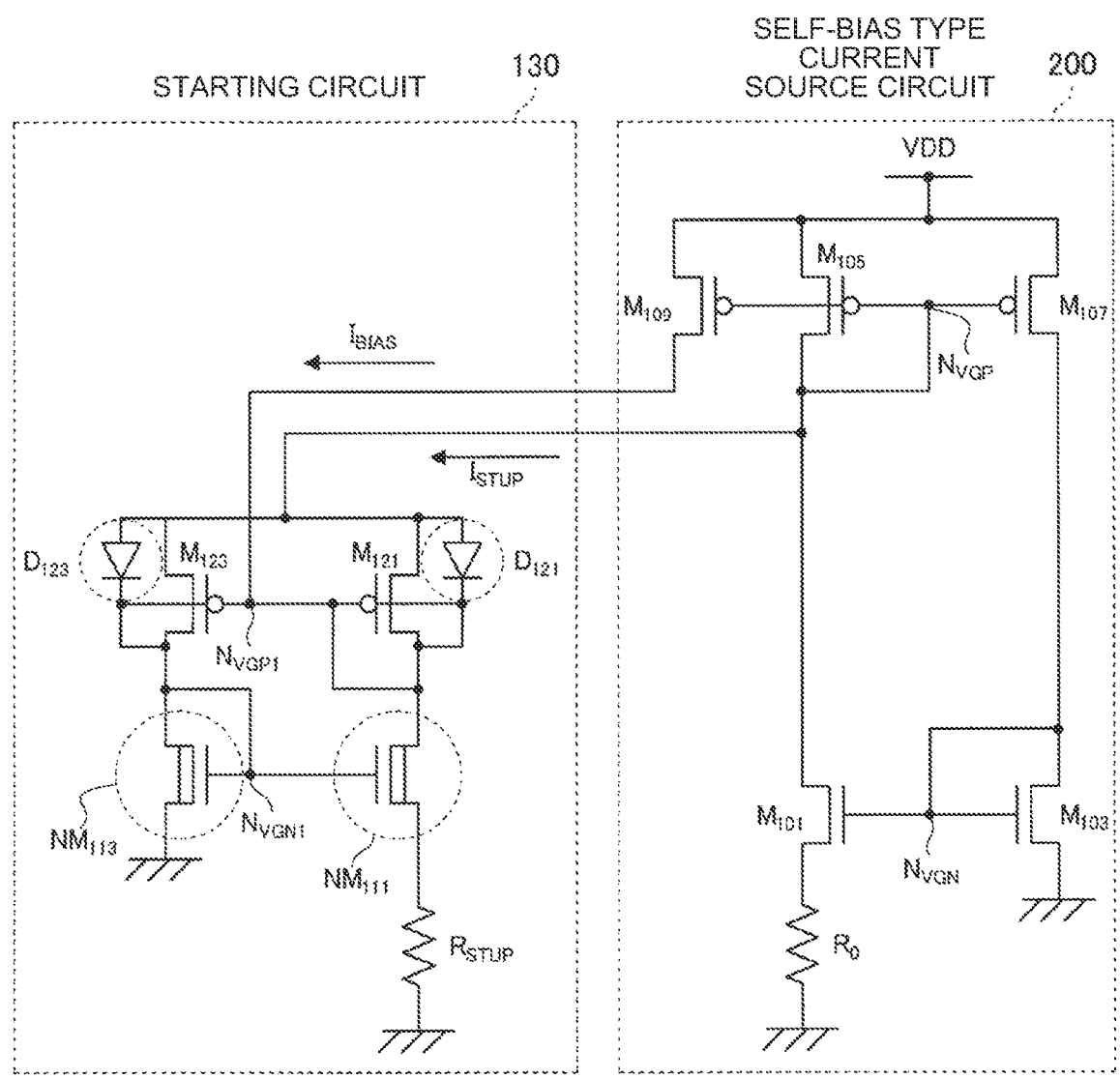
FIG. 12 is an explanatory diagram for explaining a third configuration example of the starting circuit according to the embodiment.

Subsequently, a third configuration example of the starting circuit according to the embodiment of the present disclosure will be described. For example, FIG. 12 is an explanatory diagram for explaining the third configuration example of the starting circuit according to the embodiment of the present disclosure, and illustrates another example of the circuit configuration of the starting circuit illustrated in FIG. 6. Since a circuit configuration of a current source circuit 200 illustrated in FIG. 12 is substantially the same as the circuit configuration of the current source circuit 200 described with reference to FIG. 2, detailed description thereof will be omitted. Further, a starting circuit 130 illustrated in FIG. 12 corresponds to the example of the starting circuit 100 in the example illustrated in FIG. 6.

As illustrated in FIG. 12, the starting circuit 130 includes transistors $NM_{111}$ and $NM_{113}$, a resistor $R_{STUP}$, transistors $M_{121}$ and $M_{123}$, and diodes $D_{121}$ and $D_{123}$. Since the transistors $NM_{111}$ and $NM_{113}$ and the resistor $R_{STUP}$ are substantially the same as the transistors $NM_{111}$ and $NM_{113}$ and the resistor $R_{STUP}$ in the starting circuit 110 according to the first configuration example described with reference to FIG. 7, detailed description thereof will be omitted.

The transistors $M_{121}$ and $M_{123}$ configure a current mirror circuit. Specifically, the transistors $M_{121}$ and $M_{123}$ are configured as P-type MOS transistors and gate terminals thereof are electrically connected to each other. The gate terminal and the drain terminal of the transistor $M_{121}$ are electrically connected (that is, diode-connected).

A back gate terminal of each of the transistors $M_{121}$ and $M_{123}$ is electrically connected to the drain terminal. Further, the source terminal and the drain terminal of each of the transistors $M_{121}$ and $M_{123}$ are electrically connected via a parasitic diode. Specifically, the source terminal and the drain terminal of the transistor $M_{121}$ are electrically connected via the diode $D_{121}$. More specifically, in the diode $D_{121}$, the anode side is electrically connected to the source terminal of the transistor $M_{121}$ and the cathode side is electrically connected to the drain terminal of the transistor $M_{121}$. Similarly, the source terminal and the drain terminal of the transistor $M_{123}$ are electrically connected via the diode $D_{123}$. More specifically, in the diode $D_{123}$, the anode side is electrically connected to the source terminal of the transistor $M_{123}$ and the cathode side is electrically connected to the drain terminal of the transistor $M_{123}$.

The drain terminal of the transistor $M_{121}$ and the drain terminal of the transistor $NM_{111}$ are electrically connected. Further, the drain terminal of the transistor $M_{123}$ and the drain terminal of the transistor $NM_{113}$ are electrically connected. Note that, in the starting circuit 130 according to the second configuration example, the transistors $M_{121}$ and $M_{123}$ correspond to examples of a "third MOS transistor" and a "fourth MOS transistor", respectively.

Further, the source terminals of the transistors $M_{121}$ and $M_{123}$ are electrically connected to a signal line branched from the side of the drain terminal of the transistor $M_{105}$ of the current source circuit 200. Further, the side of the drain terminal of the transistor $M_{109}$ is electrically connected to the gate terminal of each of the transistors $M_{121}$ and $M_{123}$ configuring the current mirror circuit. That is, the drain terminal of the transistor $M_{109}$ and the drain terminal of the transistor $NM_{111}$ are electrically connected.

Here, the operation of the starting circuit 130, that is, the operation related to the starting of the current source circuit 200 will be described.

When the power supply voltage VDD is applied, the starting circuit 130 is turned on, and the starting current $I_{STUP}$ flows so as to be extracted from the current source circuit 200 toward the starting circuit 130. Specifically, the starting current $I_{STUP}$ flows from the side of the drain terminal of the transistor $M_{105}$ toward the source terminal of each of the transistors $M_{121}$ and $M_{123}$. At this time, as the voltage value of the power supply voltage VDD increases, the current value of the starting current $I_{STUP}$ increases, and as the current value of the starting current $I_{STUP}$ increases, the potential of the node $N_{VGP1}$ (that is, the gate voltage of each of the transistors $M_{121}$ and $M_{123}$) increases. Then, in each of the transistors $M_{121}$ and $M_{123}$, when the gate-source voltage sufficiently exceeds the threshold voltage, each of the transistors $M_{121}$ and $M_{123}$ transitions to the conductive state, and the increase in the power supply voltage VDD stops.

When each of the transistors $M_{121}$ and $M_{123}$ transitions to the conductive state, a drain current according to the starting current $I_{STUP}$ flows through the transistor $NM_{121}$ from the drain terminal of the transistor $M_{121}$. At this time, a current obtained by replicating the drain current by the current mirror circuit configured by the transistors $M_{121}$ and $M_{123}$ flows toward the side of the drain terminal of the transistor $NM_{123}$.

As described above, the gate terminal and the drain terminal of the transistor $NM_{113}$ are electrically connected, and the current flowing through the side of the drain terminal of the transistor $NM_{113}$ is supplied to the node $N_{VGN1}$ (that is, the gate terminal of each of the transistors $NM_{111}$ and $NM_{113}$). With the above configuration, the gate voltage of each of the transistors $NM_{111}$ and $NM_{113}$ (that is, the potential of the node $N_{VGN0}$ is controlled to a voltage according to the threshold voltage of the transistor $NM_{111}$. The present operation is the same as that of the starting circuit 110 according to the first configuration example described with reference to FIGS. 7 and 8.

In the current source circuit 200, when the transistor $M_{107}$ transitions to the conductive state, the potential of the node $N_{VGN}$ electrically connected to the side of the drain terminal of the transistor $M_{107}$ increases, and the potential of the node $N_{VGP}$ (that is, the gate voltage of each of the transistors $M_{105}$, $M_{107}$, and $M_{109}$) decreases in conjunction with the increase in the potential. Further, as the potential of the node $N_{VGN}$ increases, the transistors $M_{101}$ and $M_{103}$ transition to the conductive state, and the increase in the potential of the node $N_{VGN}$ and the decrease in the potential of the node $N_{VGP}$ stop. As described above, the starting of the current source circuit 200 is completed, and a signal (drain current) flows between the source and the drain of each of the transistors $M_{101}$, $M_{103}$, $M_{105}$, $M_{107}$, and $M_{109}$ configuring the current source circuit 200.

When the starting of the current source circuit 200 is completed, the signal transmitted between the source and the drain of the transistor $M_{109}$ is supplied as the bias current $I_{BIAS}$ to the node $N_{VGP1}$ (that is, the gate terminal of each of the transistors $M_{121}$ and $M_{123}$). As a result, the potential of the gate terminal of each of the transistors $M_{121}$ and $M_{123}$ increases, so that the potential of the drain terminal of the transistor $NM_{111}$ electrically connected to the gate terminal also increases. At this time, a current value of the bias current $I_{BIAS}$ set by an aspect ratio (W/L ratio) of the transistors $M_{105}$ and $M_{109}$ is set to a value sufficiently larger than a current value of the drain current of the transistor $NM_{111}$ to be a value obtained by dividing a gate-source voltage $V_{gs}$ of the transistor $NM_{111}$ by the resistor $R_{STUP}$, so that the drain voltage of the transistor $NM_{111}$ (that is, the gate voltage of each of the transistors $M_{121}$ and $M_{123}$) can be increased to the power supply voltage VDD.

Then, in each of the transistors $M_{121}$ and $M_{123}$, when the gate-source voltage is sufficiently lower than the threshold voltage, each of the transistors $M_{121}$ and $M_{123}$ transitions to the non-conductive state. At this time, a potential difference between the source terminal side and the drain terminal side of each of the transistors $M_{121}$ and $M_{123}$ corresponds to a potential difference between the anode side and the cathode side of each of the diodes $D_{121}$ and $D_{123}$. In each of the diodes $D_{121}$ and $D_{123}$, the anode side is electrically connected to the drain terminal side of the transistor $M_{109}$ of the current source circuit 200, and the cathode side is electrically connected to the drain terminal side of the transistor $M_{105}$ of the current source circuit 200. For this reason, in each of the diodes $D_{121}$ and $D_{123}$, when the potential on the cathode side increases with the supply of the bias current $I_{BIAS}$, the potential difference between the anode side and the cathode side becomes smaller, and the flow of the starting current $I_{STUP}$ is limited. In each of the diodes $D_{121}$ and $D_{123}$, when the potential of the cathode side increases more than the potential of the anode side (in other words, the potential of the node $N_{VGP}$), reverse bias is applied to each of the diodes $D_{121}$ and $D_{123}$. That is, the flow of the starting current $I_{STUP}$ from the current source circuit 200 to the starting circuit 130 is interrupted, and the starting circuit 130 transitions to the off state.

The third configuration example of the starting circuit according to the embodiment of the present disclosure has been described above with reference to FIG. 12.

3.5. Supplement

The configurations described above as the first to third configuration examples are merely examples, and if the operation principle described with reference to FIG. 6 can be realized, the circuit configuration of the starting circuit according to the embodiment of the present disclosure is not limited. As a specific example, in the starting circuit 130 according to the third configuration example, similarly to the starting circuit 120 according to the second configuration example, a configuration corresponding to the transistor $NM_{115}$ in the starting circuit 120 may be interposed between the source terminal of the transistor $NM_{113}$ and the ground. As described above, the circuit configuration of the starting circuit according to the embodiment of the present disclosure may be appropriately changed without departing from the basic ideas of the operation principle described with reference to FIG. 6.

4. Conclusion

As described above, the starting circuit according to the embodiment of the present disclosure includes the N-type first MOS transistor whose threshold voltage is near 0 V, the resistor interposed between the source terminal of the first MOS transistor and the ground, and the control circuit controlling the gate voltage of the first MOS transistor. With the above configuration, the amount of starting current transmitted to the device to be driven and starting the device is controlled according to the control of the gate voltage by the control circuit. More specifically, the control circuit controls the gate voltage of the first MOS transistor, according to the threshold voltage of the first MOS transistor.

With the above configuration, according to the starting circuit according to the embodiment of the present disclosure, the influence of the variation in the threshold voltage of the first MOS transistor can be further reduced, and the change in the source voltage or the drain current can be further suppressed. That is, the amount of starting current transmitted to the device to be driven is also controlled according to the drain current. As described above, according to the starting circuit according to the embodiment of the present disclosure, since the change in the starting current can be further suppressed, for example, the change in the starting time of the device to be driven can be further suppressed. Therefore, for example, even in a situation where there is a constraint on the starting time of the device to be driven, it is possible to suppress an increase in the current consumption according to a design considering the margin according to the change in the starting current, and it is possible to limit a design value of the current consumption to a smaller value.

The preferred embodiments of the present disclosure have been described in detail with reference to the accompanying drawings, but the technical scope of the present disclosure is not limited to such examples. It is obvious that a person with an ordinary skill in a technological field of the present disclosure could conceive of various alterations or corrections within the scope of the technical ideas described in the appended claims, and it should be understood that such alterations or corrections will naturally belong to the technical scope of the present disclosure.

Furthermore, the effects described in the present specification are merely illustrative or exemplary and are not restrictive. That is, the technology according to the present disclosure can exhibit other effects obvious to those skilled in the art from the description of the present specification in addition to or in place of the above-described effects.

Note that the following configurations also belong to the technical scope of the present disclosure.

(1)

A starting circuit comprising:

an N-type first MOS transistor whose threshold voltage is near 0 V;

a resistor interposed between a source terminal of the first MOS transistor and a ground; and a control circuit controlling a gate voltage of the first MOS transistor, wherein an amount of first current transmitted to a device to be driven and starting the device is controlled according to the control of the gate voltage.

(2)

The starting circuit according to (1), wherein the control circuit controls the gate voltage of the first MOS transistor according to a threshold voltage of the first MOS transistor, and the amount of first current is controlled according to the control of the gate voltage.

(3)

The starting circuit according to (1) or (2), wherein the control circuit includes an N-type second MOS transistor in which a gate terminal and a drain terminal are electrically connected, the gate terminal is electrically connected to a gate terminal of the first MOS transistor, and a threshold voltage is near 0 V, and a current mirror circuit configured by P-type MOS transistors, a second current is output from the current mirror circuit to a drain terminal of the first MOS transistor, and a third current obtained by replicating the second current is output from the current mirror circuit to a drain terminal of the second MOS transistor.

(4)

The starting circuit according to (3), wherein the current mirror circuit includes a P-type third MOS transistor and a P-type fourth MOS transistor, in the third MOS transistor, a gate terminal and a drain terminal are electrically connected and the drain terminal is electrically connected to the drain terminal of the first MOS transistor, and in the fourth MOS transistor, a drain terminal is electrically connected to the drain terminal of the second MOS transistor and a source terminal is electrically connected to the ground.

(5)
The starting circuit according to (4), wherein
a potential of the drain terminal of the first MOS transistor is controlled according to the supply of a fourth current from the device to the gate terminal of each of the third MOS transistor and the fourth MOS transistor, and
the transmission of the first current is controlled according to the potential of the drain terminal.

(6)
The starting circuit according to (5), wherein
the current mirror circuit includes a P-type fifth MOS transistor, and
according to the potential of the drain terminal of the first MOS transistor, a current obtained by replicating the second current by the fifth MOS transistor is supplied as the first current from a drain terminal of the fifth MOS transistor to the device.

(7)
The starting circuit according to (5), further comprising:
a first diode whose anode side is electrically connected to a source terminal of the third MOS transistor and whose cathode side is electrically connected to the drain terminal of the third MOS transistor; and
a second diode whose cathode side is electrically connected to the source terminal of the fourth MOS transistor and whose cathode side is electrically connected to the drain terminal of the fourth MOS transistor, wherein
in each of the third MOS transistor and the fourth MOS transistor, a back gate terminal and the drain terminal are electrically connected, and
extraction of the first current to the side of the source terminal of each of the third MOS transistor and the fourth MOS transistor is controlled according to the potential of the drain terminal of the first MOS transistor.

(8)
The starting circuit according to any one of (5) to (7), wherein the source terminal of the fourth MOS transistor is electrically connected to the ground via an N-type N-type sixth MOS transistor whose threshold voltage is near 0 V.

(9)
The starting circuit according to any one of (5) to (8), wherein the device is a current source circuit.

(10)
The starting circuit according to (9), wherein
the device is a self-bias type current source circuit, and
a part of a current flowing through the current source circuit is supplied to the gate terminal of each of the third MOS transistor and the fourth MOS transistor as the fourth current.

REFERENCE SIGNS LIST

100, 110, 120, 130 STARTING CIRCUIT
101 STARTING CURRENT GENERATION CIRCUIT
103 GATE VOLTAGE CONTROL CIRCUIT
200 CURRENT SOURCE CIRCUIT
$NM_{11}$ N-TYPE MOS TRANSISTOR
$R_{STUP}$ RESISTOR

The invention claimed is:
1. A starting circuit, comprising:
an N-type first MOS transistor, wherein a threshold voltage of the N-type first MOS transistor is near 0 V;
a resistor between a source terminal of the N-type first MOS transistor and a ground; and
a control circuit configured to control a gate voltage of the N-type first MOS transistor, wherein
an amount of a first current transmitted to a device to be driven and starting the device is controlled based on the control of the gate voltage of the N-type first MOS transistor, and
the control circuit includes:
an N-type second MOS transistor, wherein a threshold voltage of the N-type second MOS transistor is near 0 V; and
a current mirror circuit that includes:
a P-type third MOS transistor; and
a P-type fourth MOS transistor, wherein
a second current is output from the current mirror circuit to a drain terminal of the N-type first MOS transistor,
a third current is output from the current mirror circuit to a drain terminal of the N-type second MOS transistor,
the third current is obtained based on a replication of the second current,
a potential of the drain terminal of the N-type first MOS transistor is controlled based on supply of a fourth current from the device to a gate terminal of the P-type third MOS transistor and a gate terminal of the P-type fourth MOS transistor, and
the transmission of the first current is controlled based on the potential of the drain terminal of the N-type first MOS transistor.

2. The starting circuit according to claim 1, wherein
the control circuit is further configured to control the gate voltage of the N-type first MOS transistor based on the threshold voltage of the N-type first MOS transistor, and
the amount of the first current is controlled based on the control of the gate voltage of the N-type first MOS transistor.

3. The starting circuit according to claim 1, wherein
a gate terminal of the N-type second MOS transistor and the drain terminal of the N-type second MOS transistor are electrically connected, and
the gate terminal of the N-type second MOS transistor is electrically connected to a gate terminal of the first MOS transistor.

4. The starting circuit according to claim 1, wherein
the gate terminal of the P-type third MOS transistor and a drain terminal of the P-type third MOS transistor are electrically connected,
the drain terminal of the P-type third MOS transistor is electrically connected to the drain terminal of the first MOS transistor,
a drain terminal of the P-type fourth MOS transistor is electrically connected to the drain terminal of the N-type second MOS transistor, and
a source terminal of the P-type fourth MOS transistor is electrically connected to the ground.

5. The starting circuit according to claim 1, wherein
the current mirror circuit further includes a P-type fifth MOS transistor, and
based on the potential of the drain terminal of the N-type first MOS transistor, a current obtained based on the replication of the second current by the P-type fifth MOS transistor is supplied as the first current from a drain terminal of the P-type fifth MOS transistor to the device.

6. The starting circuit according to claim 1, further comprising:
a first diode, wherein
an anode side of the first diode is electrically connected to a source terminal of the P-type third MOS transistor, and
a cathode side of the first diode is electrically connected to a drain terminal of the P-type third MOS transistor; and
a second diode, wherein
an anode side of the second diode is electrically connected to a source terminal of the P-type fourth MOS transistor, and
a cathode side of the second diode is electrically connected to the drain terminal of the P-type fourth MOS transistor, wherein
a back gate terminal of the P-type third MOS transistor and the drain terminal of the P-type third MOS transistor are electrically connected,
a back gate terminal of the P-type fourth MOS transistor and a drain terminal of the P-type fourth MOS transistor are electrically connected, and
extraction of the first current to the source terminal of the P-type third MOS transistor and the source terminal of the P-type fourth MOS transistor is controlled based on the potential of the drain terminal of the N-type first MOS transistor.

7. The starting circuit according to claim 1, wherein
a source terminal of the P-type fourth MOS transistor is electrically connected to the ground via an N-type sixth MOS transistor, and
a threshold voltage of the N-type sixth MOS transistor is near 0 V.

8. The starting circuit according to claim 1, wherein the device is a current source circuit.

9. The starting circuit according to claim 8, wherein
the device is a self-bias type current source circuit, and
a part of a current flowing through the current source circuit is supplied to the gate terminal of the P-type third MOS transistor and the gate terminal of the P-type fourth MOS transistor as the fourth current.

10. A starting circuit, comprising:
an N-type first MOS transistor, wherein a threshold voltage of the N-type first MOS transistor is near 0 V;
a resistor between a source terminal of the N-type first MOS transistor and a ground; and
a control circuit configured to control a gate voltage of the N-type first MOS transistor, wherein an amount of first current transmitted to a device to be driven and starting the device is controlled based on the control of the gate voltage of the N-type first MOS transistor, and
the control circuit includes:
an N-type second MOS transistor, wherein
a gate terminal of the N-type second MOS transistor and a drain terminal of the N-type second MOS transistor are electrically connected,
the gate terminal of the N-type second MOS transistor is electrically connected to a gate terminal of the N-type first MOS transistor, and
a threshold voltage of the N-type second MOS transistor is near 0 V; and
a current mirror circuit that includes:
a P-type third MOS transistor, wherein
a gate terminal of the P-type third MOS transistor and a drain terminal of the P-type third MOS transistor are electrically connected, and
the drain terminal of the P-type third MOS transistor is electrically connected to a drain terminal of the N-type first MOS transistor; and
a P-type fourth MOS transistor, wherein
a drain terminal of the P-type fourth MOS transistor is electrically connected to the drain terminal of the N-type second MOS transistor, and
a source terminal of the P-type fourth MOS transistor is electrically connected to the ground, wherein
a second current is output from the current mirror circuit to the drain terminal of the N-type first MOS transistor,
a third current is output from the current mirror circuit to the drain terminal of the N-type second MOS transistor,
the third current is obtained based on replication of the second current,
a potential of the drain terminal of the N-type first MOS transistor is controlled based on supply of a fourth current from the device to the gate terminal of the P-type third MOS transistor and a gate terminal of the P-type fourth MOS transistor, and
the transmission of the first current is controlled based on the potential of the drain terminal of the N-type first MOS transistor.

* * * * *